(12) United States Patent
Gardner et al.

(10) Patent No.: US 12,133,387 B2
(45) Date of Patent: Oct. 29, 2024

(54) 3D MEMORY WITH CONDUCTIVE DIELECTRIC CHANNEL INTEGRATED WITH LOGIC ACCESS TRANSISTORS

(71) Applicant: Tokyo Electron Limited, Tokyo (JP)

(72) Inventors: Mark I. Gardner, Albany, NY (US); H. Jim Fulford, Albany, NY (US); Partha Mukhopadhyay, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 394 days.

(21) Appl. No.: 17/556,943

(22) Filed: Dec. 20, 2021

(65) Prior Publication Data
US 2023/0200065 A1    Jun. 22, 2023

(51) Int. Cl.
*H10B 43/27* (2023.01)
*H10B 41/27* (2023.01)
*H10B 41/41* (2023.01)
*H10B 43/40* (2023.01)

(52) U.S. Cl.
CPC ............. *H10B 43/27* (2023.02); *H10B 41/27* (2023.02); *H10B 41/41* (2023.02); *H10B 43/40* (2023.02)

(58) Field of Classification Search
CPC ........ H10B 43/27; H10B 41/27; H10B 41/41; H10B 43/40; H10B 43/10
See application file for complete search history.

(56) References Cited

U.S. PATENT DOCUMENTS

| 9,024,376 | B2 | 5/2015 | Masuoka et al. |
| 9,425,324 | B2 | 8/2016 | Diaz et al. |
| 9,478,624 | B2 | 10/2016 | Colinge et al. |
| 2019/0043873 | A1* | 2/2019 | Hasnat ............... H10B 41/27 |
| 2020/0227525 | A1* | 7/2020 | Ji ............... H01L 29/407 |
| 2021/0183887 | A1* | 6/2021 | Tang ............... G11C 16/10 |

* cited by examiner

Primary Examiner — J. E. Schoenholtz
(74) Attorney, Agent, or Firm — Foley & Lardner LLP

(57) ABSTRACT

Three-dimensional (3D) memory structures and methods to manufacture 3D memory structures are disclosed. A method includes forming a stack of layers including a first sub-stack for a first transistor structure, comprised of a first conductive layer, a gate layer, and a second source/drain layer. The stack of layers can include a second sub-stack for a memory structure positioned on the first sub-stack, the second sub-stack including at least one layer of conductive material and at least one layer of non-conductive material, and a third sub-stack for a second transistor structure. The method includes forming a channel opening in the stack of layers, providing a first channel structure within the channel opening, forming a memory dielectric layer in the channel opening and aligned with the memory structure, and providing a second channel structure in the channel opening in contact with the memory dielectric layer and aligned with the second transistor structure.

16 Claims, 24 Drawing Sheets

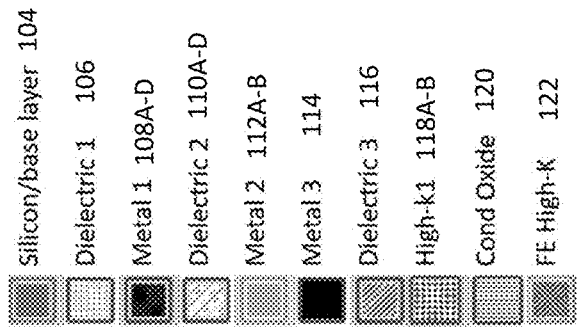
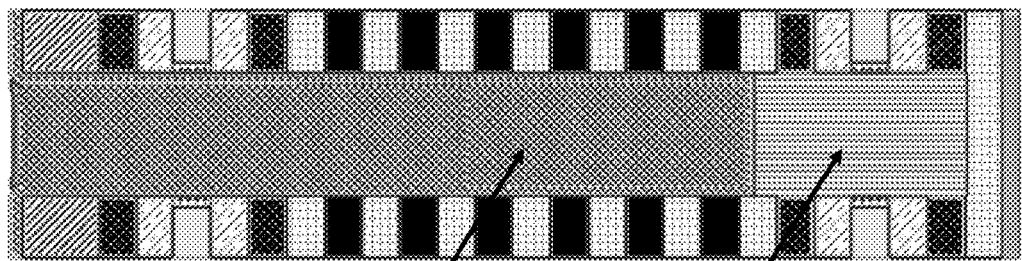
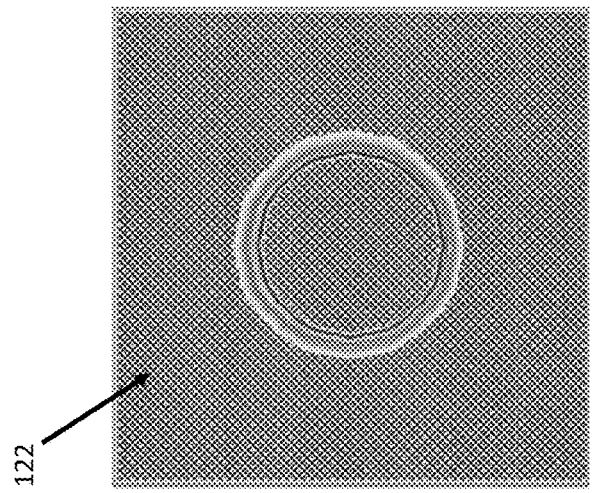
FIG. 5

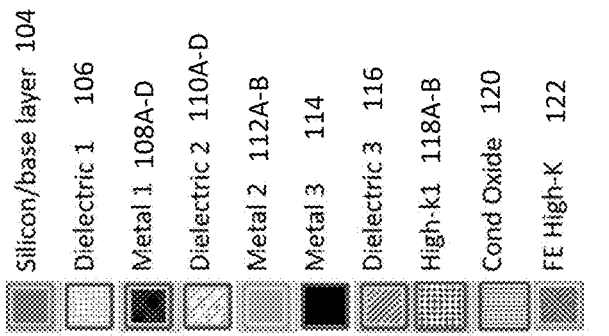
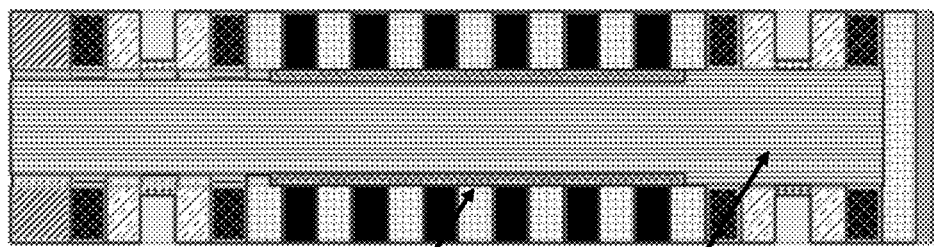
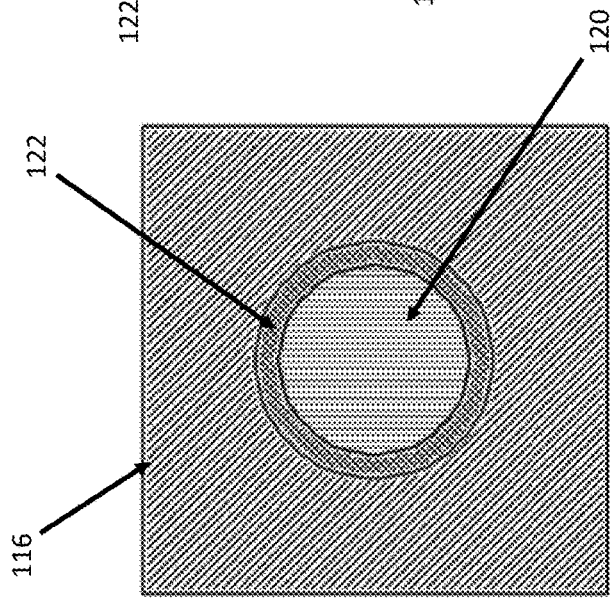
FIG. 7

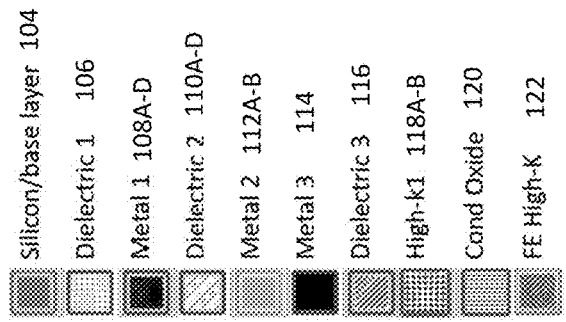
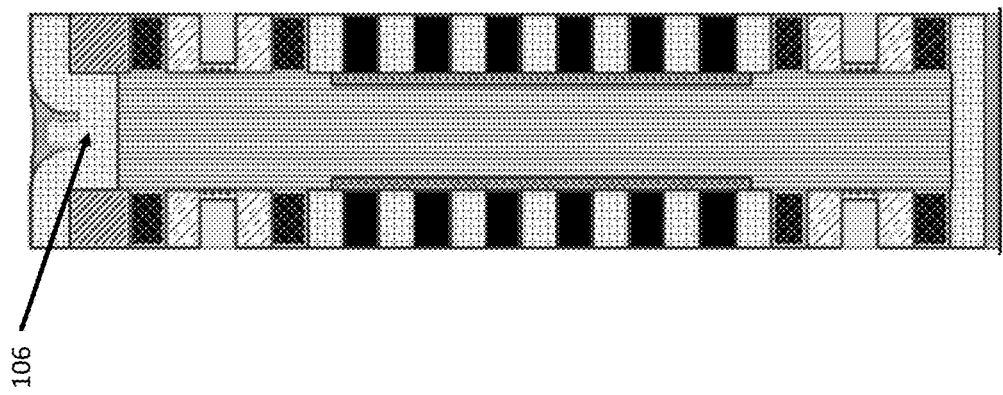
Cross-Sectional View 902
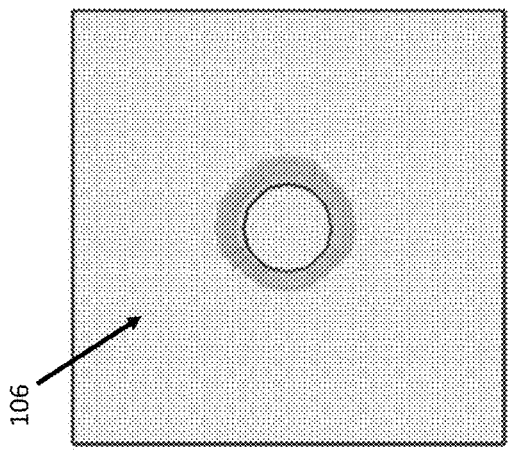
Top View 900
FIG. 9

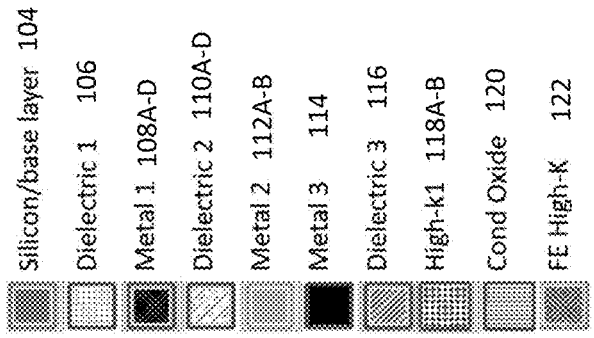
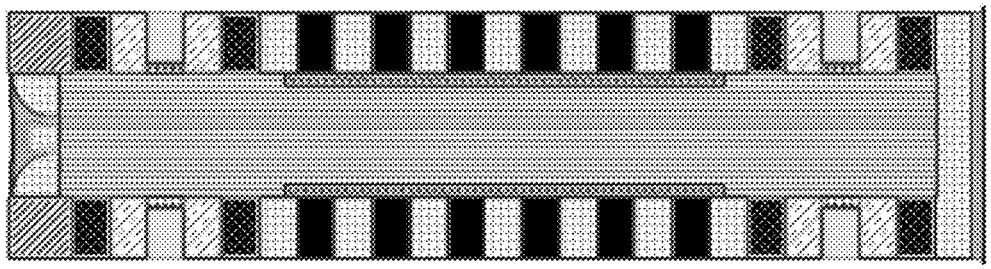
Cross-Sectional View 1002
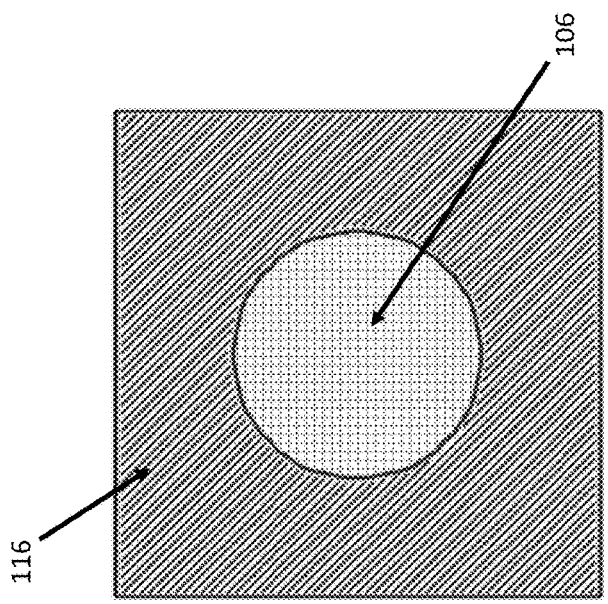
Top View 1000
FIG. 10

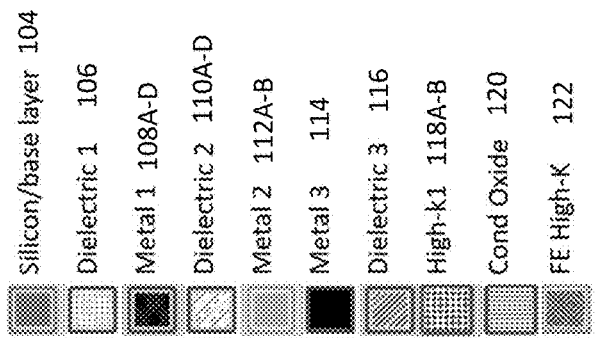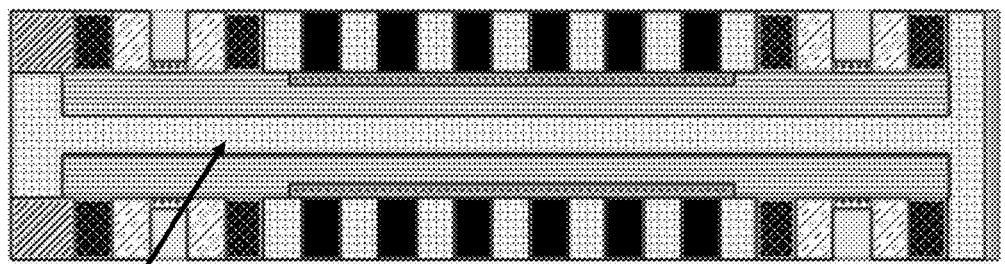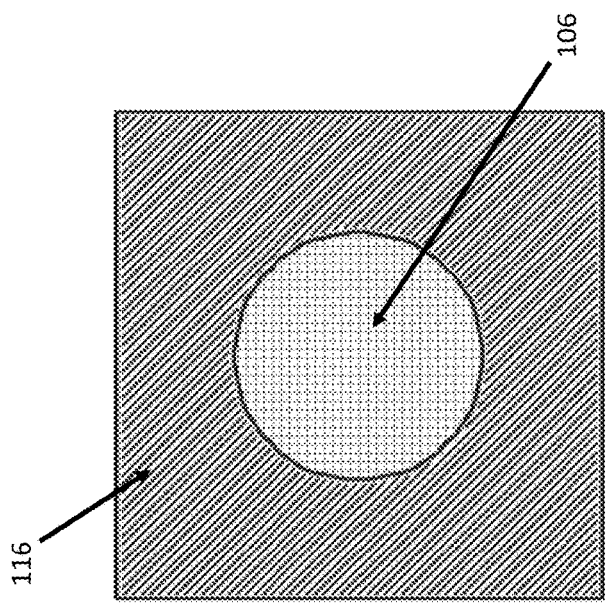
FIG. 11

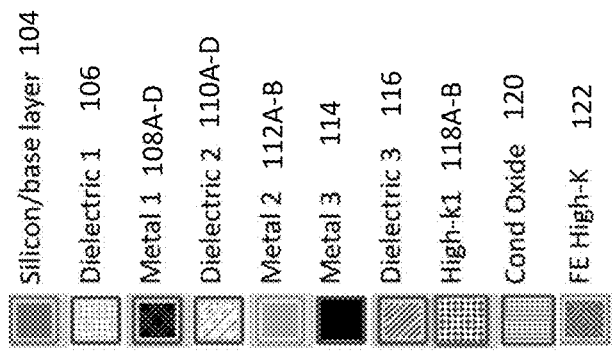
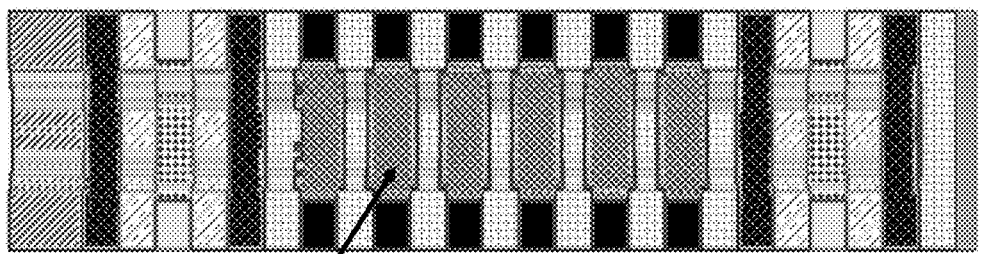
Cross-Sectional View 1302
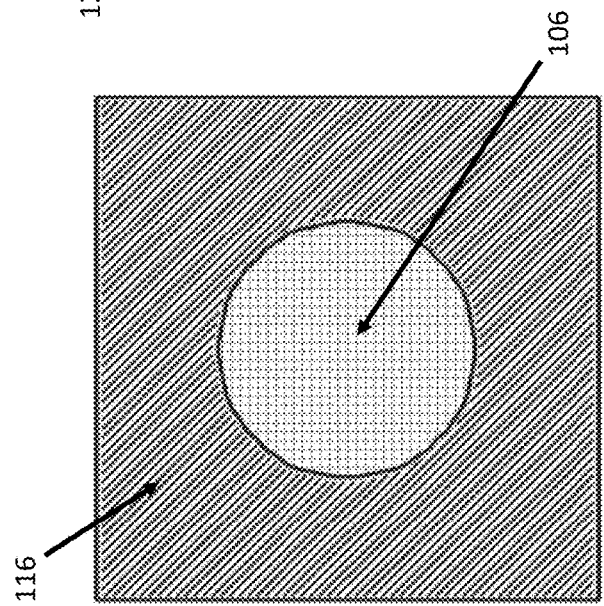
Top View 1300
FIG. 13

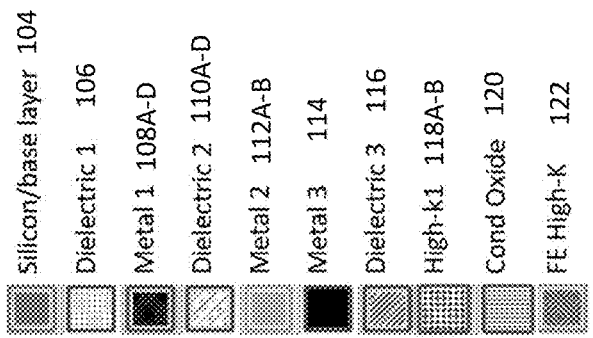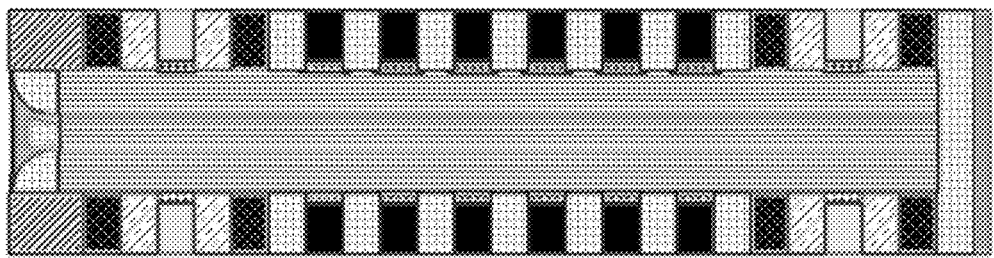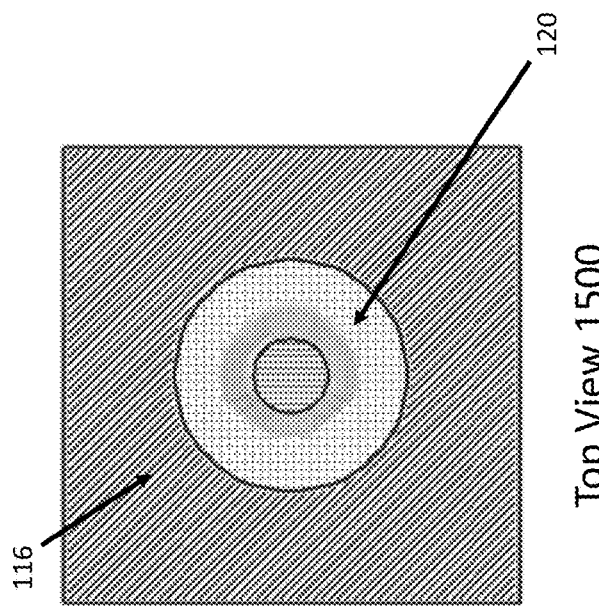
FIG. 15

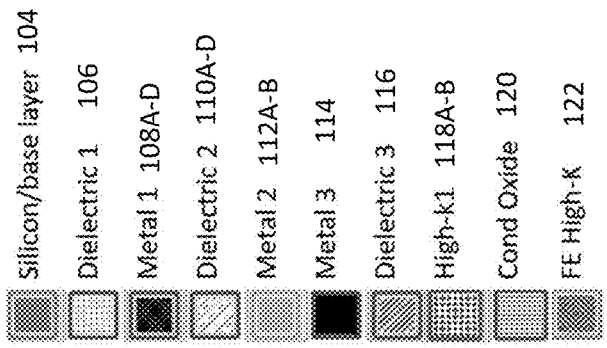
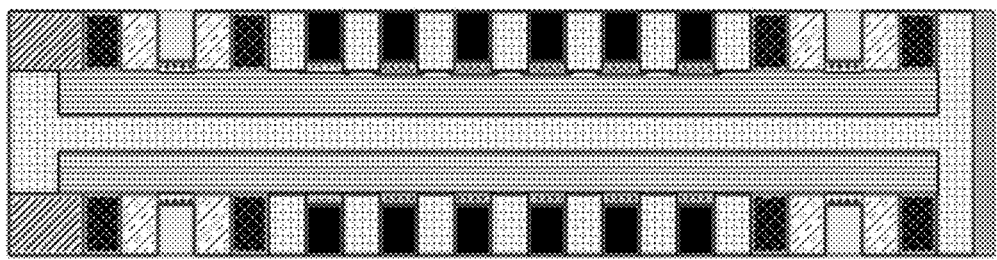
Cross-Sectional View 1602
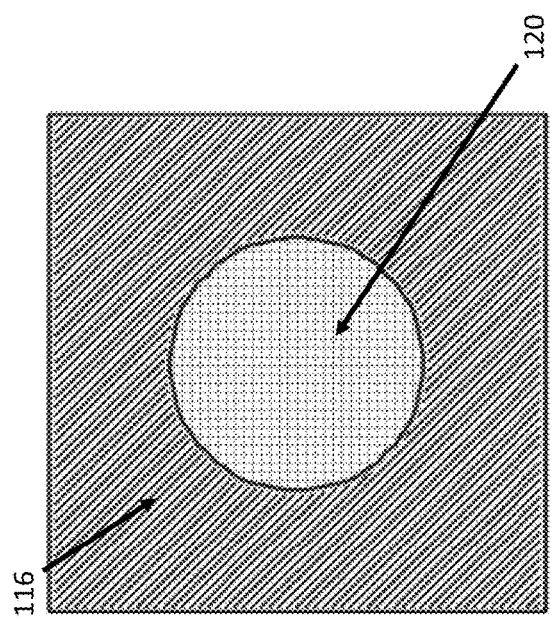
Top View 1600
FIG. 16

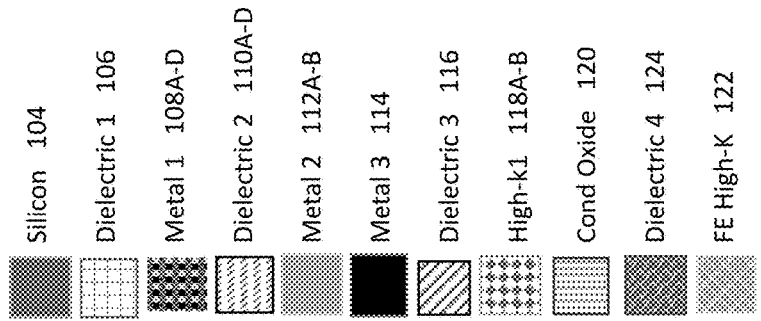
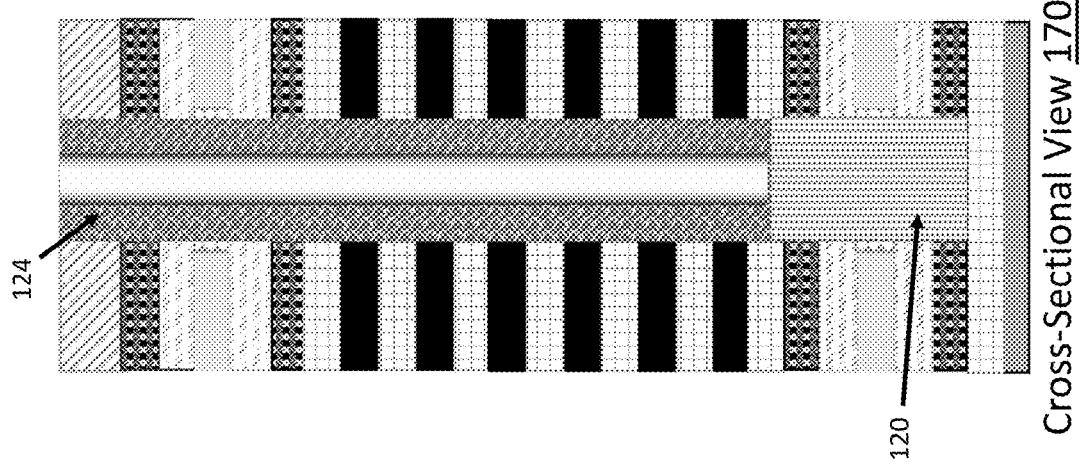
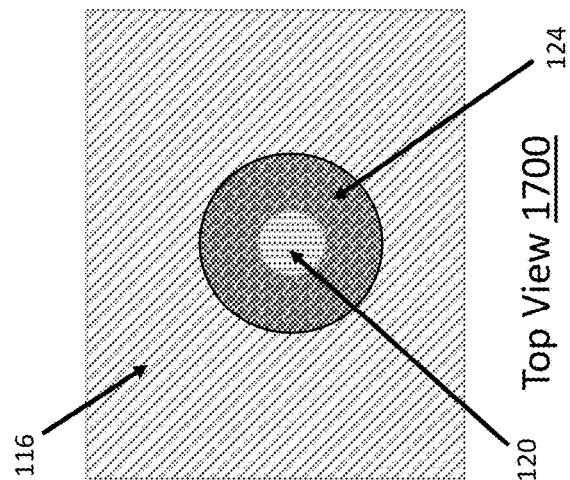
FIG. 17

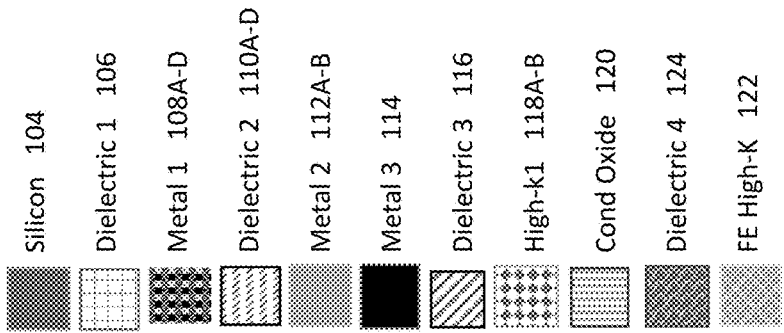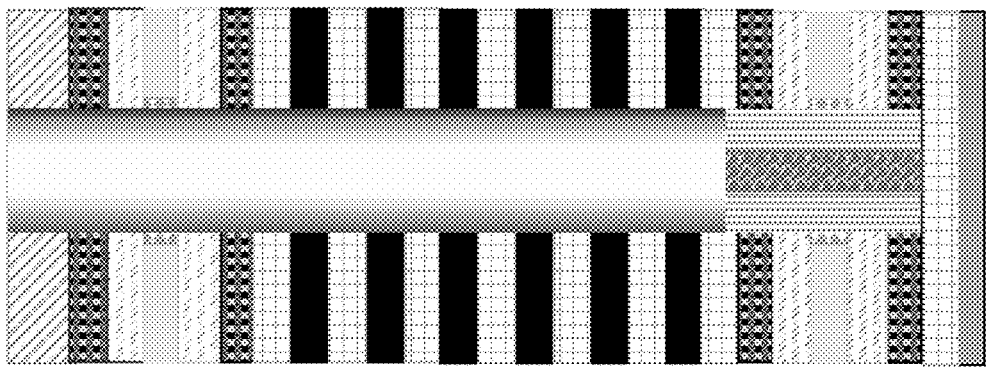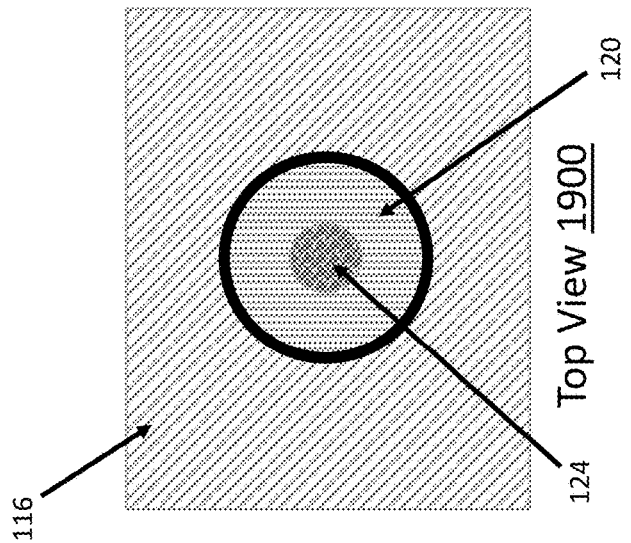
FIG. 19

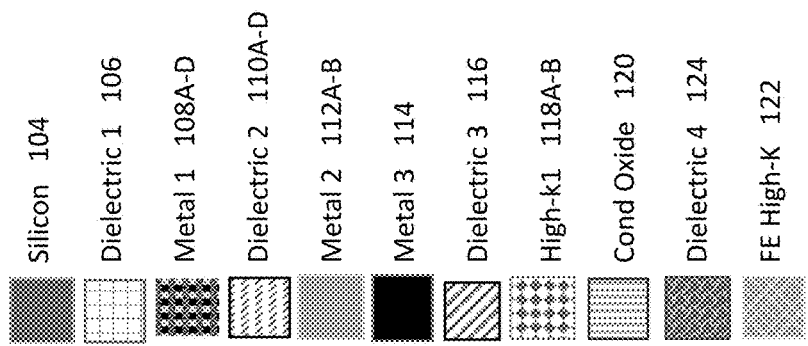
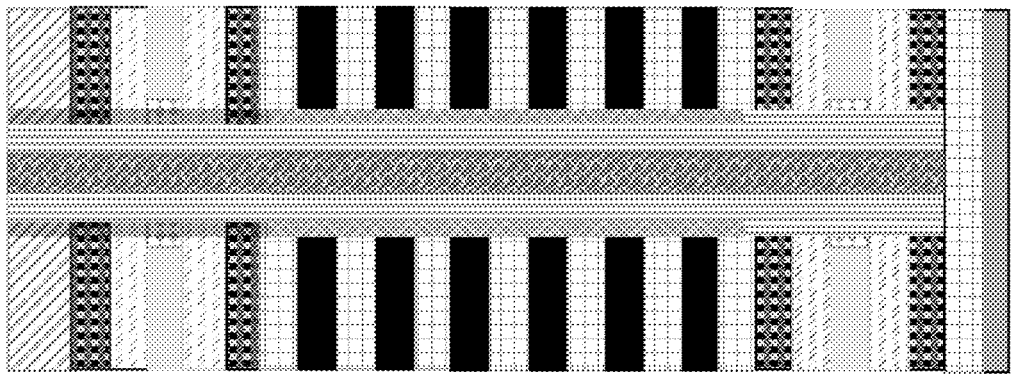
Cross-Sectional View 2302
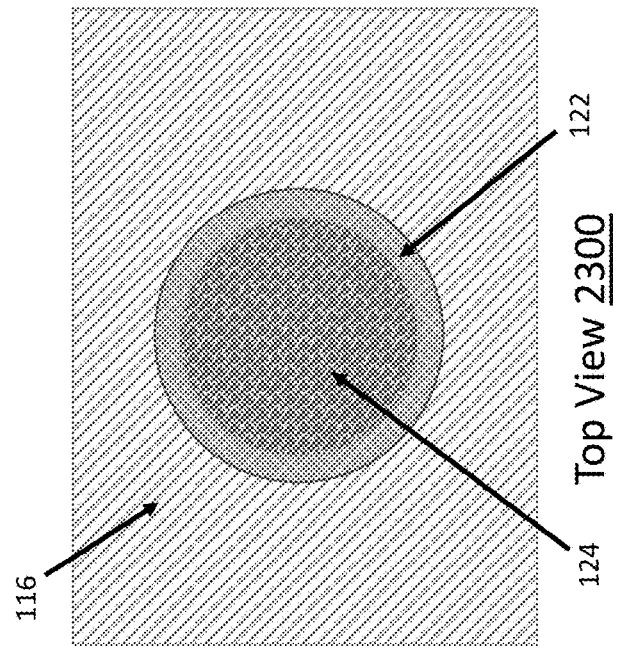
Top View 2300
FIG. 23

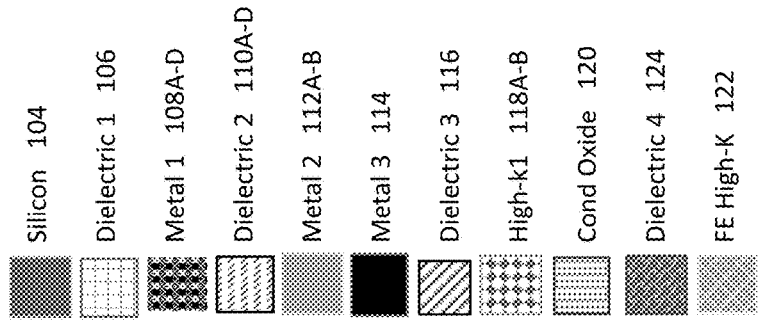
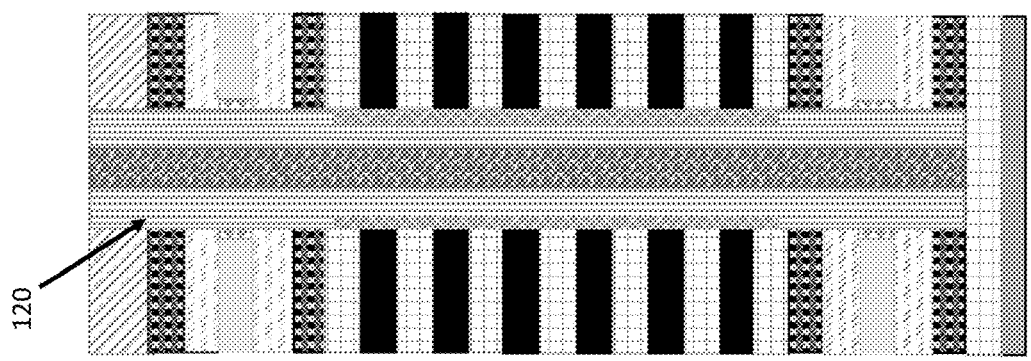
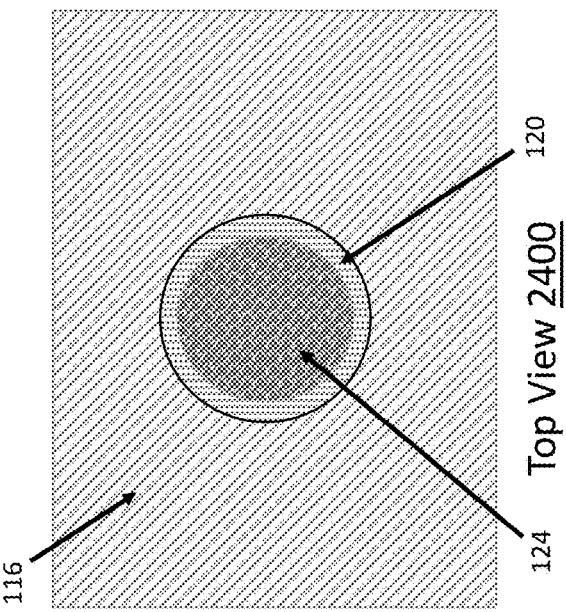
FIG. 24

3D MEMORY WITH CONDUCTIVE DIELECTRIC CHANNEL INTEGRATED WITH LOGIC ACCESS TRANSISTORS

TECHNICAL FIELD

The present invention relates generally to the field of manufacturing semiconductor devices.

BACKGROUND

In the manufacture of semiconductor devices (especially on the microscopic scale), various fabrication processes are executed, such as film-forming depositions, etch mask creation, patterning, material etching and removal, and doping treatments. These processes are performed repeatedly to form desired semiconductor device elements on a substrate. Conventional microfabrication techniques only manufacture transistors in one plane, while wiring or metallization is formed above the active device plane. Such devices are accordingly characterized as two-dimensional (2D) circuits, manufactured using 2D fabrication techniques. Although scaling efforts have greatly increased the number of transistors per unit area in 2D circuits, these 2D fabrication techniques are approaching physical atomic limitations with single digit nanometer semiconductor device fabrication nodes. Semiconductor device fabricators, including memory device manufacturers, have expressed a desire for different manufacturing techniques and configurations of devices to increase density of semiconductor circuitry.

SUMMARY

Three-dimensional (3D) integration, for example, a stacking (or vertical arrangement) of multiple semiconductor devices (e.g., transistor structures, memory structures, etc.), aims to overcome scaling limitations experienced in planar devices by increasing transistor density in volume rather than area. Although device stacking has been successfully demonstrated and implemented by the flash memory industry with the adoption of 3D NAND, applying similar techniques to random logic designs is substantially more difficult. 3D integration for logic chips, including central processing units (CPU), graphics processing units (GPU), and field-programmable gate arrays (FPGA) are being pursued. The techniques described herein extend the manufacturing processes used to create 3D NAND memory with 3D logic integration.

At least one aspect of the present disclosure is directed to a method for forming a stack of layers. The stack of layers can include a first sub-stack for a first transistor structure. The first sub-stack can include a first conductive source/drain layer, a first gate conductive layer separated from the first conductive source/drain layer by at least one dielectric layer, and a second source/drain layer separated from the first gate conductive layer by at least one dielectric layer. The stack of layers can include a second sub-stack for a memory structure positioned on the first sub-stack, the second sub-stack including at least one layer of conductive material and at least one layer of non-conductive material. The stack of layers can include a third sub-stack for a second transistor structure. The third sub-stack can include a third conductive source/drain layer, a second gate conductive layer separated from the third conductive source/drain layer by at least one dielectric layer, and a fourth source/drain layer separated from the second gate conductive layer by at least one dielectric layer. The method can include forming a channel opening in the stack of layers. The method can include providing a first channel structure within the channel opening. The first channel structure can include a semiconductive-behaving material and aligned with the first transistor structure. The method can include forming a memory dielectric layer in the channel opening and aligned with the memory structure. The method can include providing a second channel structure in the channel opening in contact with the memory dielectric layer and aligned with the second transistor structure.

The method can include forming a first gate dielectric on the first gate conductive layer prior to providing the first channel structure. Forming the first gate dielectric may further comprise forming a second gate dielectric on the second gate conductive layer prior to forming the second channel structure. The method can include forming a core channel opening through the first channel structure and the second channel structure.

Forming the core channel can include forming a self-aligned space on the second channel structure. Forming the core channel can include forming a self-aligned dielectric in the self-aligned space. Forming the core channel can include etching the core channel opening through the self-aligned space, the second channel structure, and the first channel structure.

The method can include forming a core dielectric in the core channel opening. The first channel structure and the second channel structure may be the same material. The method can include removing a portion of the memory dielectric layer that is aligned with the second transistor structure to form a gap. The method can include filling the gap with the semiconductive-behaving material to couple the second channel structure with the second transistor structure.

At least one other aspect of the present disclosure is directed to another method for forming a stack of layers. The stack of layers can include a first sub-stack for a first transistor structure. The first sub-stack can include a first conductive source/drain layer, a first gate conductive layer separated from the first conductive source/drain layer by at least one dielectric layer, and a second source/drain layer separated from the first gate conductive layer by at least one dielectric layer. The stack of layers can include a second sub-stack for a memory structure positioned on the first sub-stack. The second sub-stack can include at least one layer of conductive material and at least one layer of non-conductive material. The stack of layers can include a third sub-stack for a second transistor structure. The third sub-stack can include a third conductive source/drain layer, a second gate conductive layer separated from the third conductive source/drain layer by at least one dielectric layer, and a fourth source/drain layer separated from the second gate conductive layer by at least one dielectric layer. The method can include forming a channel opening in the stack of layers. The method can include forming a memory gate dielectric layer in the channel opening on the at least one layer of conductive material in the second sub-stack. The method can include providing a channel structure in the channel opening in contact with the memory gate dielectric layer and aligned with the first transistor structure and the second transistor structure.

Forming the memory gate dielectric layer can include selectively depositing the memory gate dielectric layer on the at least one layer of conductive material in the second sub-stack. The method can include forming a dielectric cap on the channel structure.

Forming the memory gate dielectric layer on the at least one layer of conductive material can include etching a portion of the at least one layer of conductive material to create a recessed gap in the channel opening. Forming the memory gate dielectric layer on the at least one layer of conductive material can include forming the memory gate dielectric layer on the at least one layer of conductive material such that the memory gate dielectric layer fills the recessed gap.

The method can include forming a core channel opening through the channel structure. Forming the core channel opening can include forming a self-aligned space on the channel structure. Forming the core channel opening can include forming a self-aligned dielectric in the self-aligned space. Forming the core channel opening can include etching the core channel opening through the self-aligned space and the channel structure. In some implementations, the method can include forming a core dielectric in the core channel opening.

At least one other aspect of the present disclosure is directed to another method for forming a stack of layers. The stack of layers can include a first sub-stack for a first transistor structure. The first sub-stack can include a first conductive source/drain layer, a first gate conductive layer separated from the first conductive source/drain layer by at least one dielectric layer, and a second source/drain layer separated from the first gate conductive layer by at least one dielectric layer. The stack of layers can include a second sub-stack for a memory structure positioned on the first sub-stack. The second sub-stack can include at least one layer of conductive material and at least one layer of non-conductive material. The stack of layers can include a third sub-stack for a second transistor structure. The third sub-stack can include a third conductive source/drain layer, a second gate conductive layer separated from the third conductive source/drain layer by at least one dielectric layer, and a fourth source/drain layer separated from the second gate conductive layer by at least one dielectric layer. The method can include forming a channel opening in the stack of layers. The method can include providing a first channel structure within the channel opening. The first channel structure can include a semiconductive-behaving material and can be aligned with the first transistor structure. The method can include depositing a memory dielectric layer in the channel opening and aligned with the memory structure. The method can include depositing a second channel structure in the channel opening and aligned with the second transistor structure. The second channel structure can be in contact with the memory dielectric layer and can define a core opening. The method can include forming a core dielectric in the core opening.

The method can include forming a second core opening in the first channel structure. The method can include forming a second core dielectric in the second core opening. The method can include removing a portion of the memory dielectric layer that is aligned with the second transistor structure to form a gap. The method can include filling the gap with the semiconductive-behaving material to couple the second transistor structure to the second channel structure. Depositing the memory dielectric layer may be performed using an atomic layer deposition (ALD) process. The memory dielectric layer may be a hafnium zirconium oxide.

At least one other aspect of the present disclosure is directed to a device comprising a first sub-stack including a first 3D logic structure; a second sub-stack including 3D NAND structure; and a third sub-stack including a second 3D logic structure, wherein the first sub-stack, the second sub-stack, and the third sub-stack are vertically aligned along a central channel structure.

The first sub-stack may comprise a first source/drain layer; a gate conductive layer separated from the first source/drain layer by at least one dielectric layer; and a second source/drain layer separated from the gate conductive layer by at least one dielectric layer. The second sub-stack may comprise at least one layer of non-conductive material; and at least one layer of a different non-conductive material. The third sub-stack may comprise a first source/drain layer; a gate conductive layer separated from the first source/drain layer by at least one dielectric layer; and a second source/drain layer separated from the gate conductive layer by at least one dielectric layer.

The central channel structure of the device may comprise a semiconductive-behaving material aligned with the first sub-stack; a memory dielectric layer aligned with the second sub-stack; and a semiconductive-behaving material aligned with the third sub-stack.

At least one other aspect of the present disclosure is directed to another device comprising: a stack of layers including: a first sub-stack for a first transistor structure, the first sub-stack including a first conductive source/drain layer, a first gate conductive layer separated from the first conductive source/drain layer by at least one dielectric layer, and a second source/drain layer separated from the first gate conductive layer by at least one dielectric layer; a second sub-stack for a memory structure positioned on the first sub-stack, the second sub-stack including at least one layer of conductive material and at least one layer of non-conductive material; and a third sub-stack for a second transistor structure, the third sub-stack including a third conductive source/drain layer, a second gate conductive layer separated from the third conductive source/drain layer by at least one dielectric layer, and a fourth source/drain layer separated from the second gate conductive layer by at least one dielectric layer; a first channel structure comprising a semiconductive-behaving material and aligned with the first transistor structure; a memory dielectric layer in the channel opening and aligned with the memory structure; and a second channel structure in contact with the memory dielectric layer and aligned with the second transistor structure.

The device may further comprise a first gate dielectric in a recess of the first gate conductive layer. The device may further comprise a second gate dielectric in a recess of the second gate conductive layer.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a,' 'an,' and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings:

FIGS. 1-11 show cross-sectional views of a first process flow to form 3D memory structures with conductive dielectric channels integrated with vertical access transistors, according to an embodiment;

FIGS. 12-16 show cross-sectional views of a second process flow to form 3D memory structures with conductive dielectric channels integrated with vertical access transistors, according to an embodiment;

FIGS. 17-24 show cross-sectional views of a third process flow to form 3D memory structures with conductive dielectric channels integrated with vertical access transistors, according to an embodiment; and FIGS. 25-27 show flow diagrams of example methods for fabricating memory devices integrated with 3D vertical logic described in connection with FIGS. 1-25, according to an embodiment.

DETAILED DESCRIPTION

Figure 1:
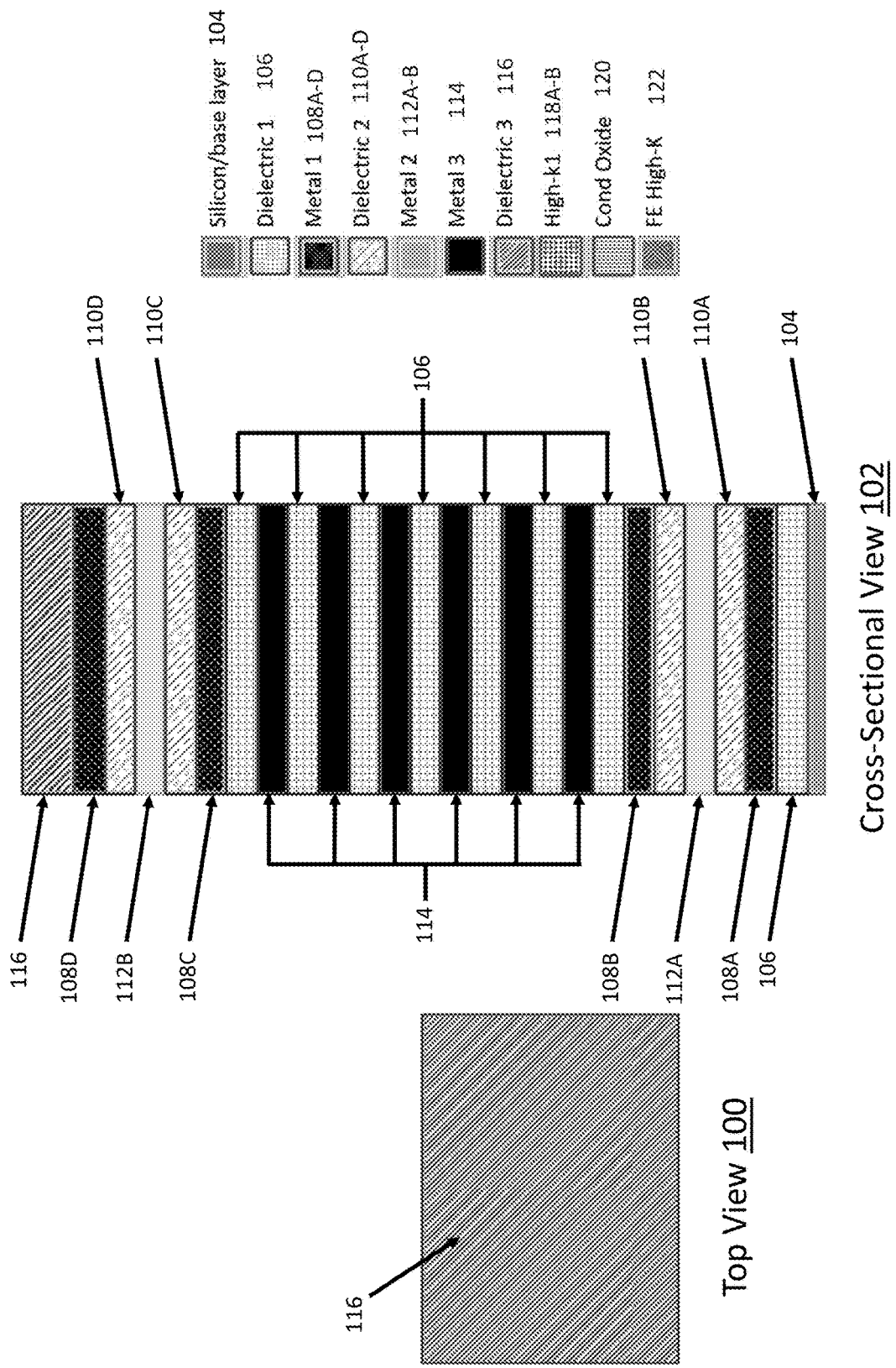

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

The embodiments described herein will refer to deposited layers, formed using material deposition or formation techniques using materials such as a conductive oxides, memory dielectric layers, non-conductive layers (e.g., dielectric layers), and conductive layers (e.g., metal layers). Advantageously, these deposited layers do not require a semiconductor base, as achieving the desired electrical characteristics does not depend on the underlying layer having a particular crystalline structure. However, one or more of these layers may alternatively be formed epitaxially with minor modifications to the described process without diverting from the scope of this disclosure. In addition, such techniques can enable N-high stacks of semiconductor devices, thereby allowing for higher circuit density. For example, any number of alternating conductive and non-conductive layers may be provided in the 3D memory structures (e.g., NAND structures) described herein. Some embodiments may include 3D stacks of vertical conductive channel nano sheets in both CFET and side-by-side configurations, which may be electrically coupled to or formed in the same material stack as part of the 3D memory structures described herein.

The process flows described herein utilize conductive dielectric materials to form 3D channel regions for the definition of vertical channel 3D memory devices, as well as NMOS and PMOS devices without using epitaxial growth. As such, the techniques described herein can be manufactured or "stacked" on any existing vertically stacked device or substrate, such as metal, plastic, or other materials, according to various implementations. The present techniques may improve upon other semiconductor manufacturing techniques by increasing the Nheight of stacked semiconductor devices, such as transistors or memory structures, thereby providing high density logic. Although not necessarily shown in some of the figures, it should be understood that various electrical connections may be formed among or between the conductive layers described herein by patterning circuits and etching vias between layers to form electronic circuits. The techniques described herein may be employed to create both charge trap type and floating gate type memory circuits.

The techniques provided herein can utilize conductive dielectric materials (sometimes referred to herein as "conductive channels"), which may have similar properties to semiconductor materials, to fabricate vertical 3D transistors. For example, certain materials, when combined with oxygen, may form new materials that exhibit semiconductor properties (e.g., can turn "off" with low off-state leakage current or can become highly conductive under certain circumstances, etc.). Some examples of N-type conductive channels include $In_2O_3$, $SnO_2$, InGaZnO, and ZnO. One example of a P-type conductive channel is SnO. Additionally or alternatively, the channel may comprise a 2D material. Some example 2D materials for use in forming the channel include, but are not limited to, $WS_2$, $WSe_2$, $WTe_2$, $MoS_2$, $MoSe_2$, $MoTe_2$, $HfS_2$, $ZrS_2$, $TiS_2$, GaSe, InSe, phosphorene, and other similar materials. The materials described herein may be deposited by an atomic layer deposition (ALD) process and may be 5-15 angstroms thick, the thinness lending to their name—2D material. Other deposition techniques may also be used, including but not limited to chemical vapor deposition (CVD), physical vapor deposition (PVD), and plasma-enhanced deposition techniques. The materials may be annealed during or after the device formation process to recrystallize or grow the crystals and thereby improve electrical characteristics. For the sake of simplicity, the use of conductive dielectrics will be disclosed.

As described briefly above, the process flows described herein may be implemented utilizing conductive channels to from the 3D channel regions of NMOS and PMOS devices without using epitaxial growth. These transistor devices may be formed in the same material stack as material layers that make up 3D memory structures, such as 3D NAND structures, thereby integrating the 3D memory structures with 3D vertical transistor structures. The devices fabricated using these techniques can be stacked on any existing device or substrate, thereby greatly increasing the number N of stacked transistors (e.g., 2, 3, 4, 5, 10, 20, 50, 100, or more) for high-density logic.

The present disclosure describes both 3D memory devices and methods to manufacture 3D memory devices. The techniques described herein provide 3D vertical memory structures, which include a conductive dielectric channel, such as a conductive oxide or other semiconductive-behaving material. The mobility of said conductive dielectric may be fifty times larger than polysilicon. Very robust off state leakage currents can be achieved with the 3D logic elements (e.g., transistors) in the memory devices. The conductive oxide material can act as a junction-less transistor (e.g., channel of source/drain and channel are the same heavy doped all N-type or all P-type). The present techniques provide 3D transistors integrated in the 3D memory stack at both the bottom and the top of the memory cell, which may be used for select or write operations. In addition, it should be understood while few transistors are shown in the Figures for ease of visualization, that the techniques described herein may be used with minor modifications to form a stack of any number of memory structures and any number of access transistors. Through the use of conductive oxides, the interface layer is reduced relative to a polysilicon channel system. Processing the structures presented herein may be performed at lower temperatures, thereby protecting silicon logic beneath the memory.

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the views depicted the Figures, connections between conductive layers or materials may be shown or may be omitted for ease of visualization. However, it should be understood that these connections between various layers and masks are merely illustrative and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although most of the figures show various layers in a cylindrical configuration, other shapes are also contemplated, and indeed the techniques described herein may be implemented in any shape or geometry. As an example, noncontiguous contact shapes such as arcs or polygonal trenches, may be adjacent to, partially surround, or fully surround a central channel in addition to or as an alternative to the shapes illustrated. In addition, examples in which two or more transistors or devices are shown stacked on top of one another are shown for illustrative purposes only, and for the purposes of simplicity. Indeed, the techniques described herein may provide for one to any number N stacked devices, which may include transistor structures, memory structures, or other electric or electronic structures. Further, although the devices fabricated using these techniques are shown as transistors and memory structures, it should be understood that any type of electric electronic device may be manufactured using such techniques, including but not limited to transistors, memory structures, variable resistors, resistors, and capacitors.

FIGS. 1-11 show cross-sectional views of a first process flow to form 3D memory structures with conductive dielectric channels integrated with vertical access transistors, according to an embodiment. Referring to FIG. 1, illustrated is a top view 100 and a cross-sectional view 102 of a device at the start of the first process flow. At the start of the first process flow, a stack of layers is formed. To form the stack of layers, a first layer of dielectric 106 (shown in the legend as the "Dielectric 1") is deposited on top of a base layer 104 (shown in the legend as the "Silicon/base layer"). As described briefly above, the techniques described herein may be implemented without requiring epitaxial growth, and therefore the base layer 104 may be any type of material capable of binding to the dielectric 106. The base layer 104 may be active or passive and may comprise dielectric, conductive or semiconductive materials or any combination thereof. The dielectric 106 may be any type of dielectric material or otherwise non-conductive material that is capable of being disposed, patterned, or otherwise provided on top of the base layer 104. Some examples of dielectric materials can include, but are not limited to, oxide materials, or other non-conductive materials. The base layer 104 may remain in the final structure or may be removed during or after the formation of the devices described herein.

As used herein, the terms "first," "second," "third," and "fourth" with respect to particular layers of the stack shown in FIGS. 1-11 refer to the order of the layers relative to the base layer 104. For example, a "first" layer of a particular type refers to the specified type of layer which is closest to the base layer 104. Likewise, a "second" layer of a particular type refers to the specified type of layer which is second closest to the base layer 104, and so on. Once the first layer of dielectric 106 (sometimes referred to herein as a "first dielectric layer") is deposited on top of the base layer 104, a first transistor structure may be formed using alternating layers of conductive and non-conductive material layers.

The term source/drain (S/D) will be used to describe layers that may be used as either a source or a drain of a transistor structure. The first S/D layer 108A (e.g., shown as "Metal 1" in the legend) may be formed directly on the base layer 104 (e.g., if the base layer 104 is non-conductive), or on the one or more dielectric layers 106 described above. The S/D layers 108A-D (sometimes generally or individually referred to as the "S/D layers 108") may be any type of conductive material, such as a metal, suitable to form a source or drain electrode in a semiconductor device. Some examples of such materials include, but are not limited to copper, gold, silver, platinum, nickel, tungsten, ruthenium, or other types of conductive metals or alloys. An insulating dielectric 110A (e.g., shown as "Dielectric 2" in the legend) is formed on the first S/D layer 108A after the first S/D layer 108A has been formed.

A gate layer 112A (e.g., shown as "Metal 2" in the legend) may then be formed on top of the first insulating dielectric layer 110A. A second insulating dielectric layer 110B and then a second S/D layer 108B is formed on the gate layer 112A. The gate layer 112A may be a different material than the first and second S/D layers 108A-B. A third insulating dielectric layer 106 may then be formed on top of the second S/D layer 108 to complete a first transistor structure. In some implementations, multiple transistor structures may be formed on top of one another prior to forming the material stacks for memory structures, as described herein. In a multi-transistor stack, the foregoing layers (not necessarily including the base layer 104) would constitute a first sub-stack. As shown in the cross-sectional view 102, a transistor structure can include four dielectric layers (with the first transistor having one dielectric layer be the dielectric layer 106, which separates the first transistor structure from the substrate 104) and three conductive metal layers (the two S/D layers 108C-D and one gate layer 112B).

Additional transistor structures (e.g., formed as additional sub-stacks) may be stacked above the first transistor structure, by depositing similar layers. One or more insulating dielectric layers 110C-D may be deposited between adjacent transistor structures. These layers in the stack of layers may be formed without a mask, such that each layer forms a blanket layer over the prior layer. The gate layers 112A-B may be a different material than the S/D layers 108 to allow selectivity in etch and deposition processes. Moreover, the gate layer for a P-type device may be selected to be different from the gate layer 112A-B of an N-type device. A non-exhaustive list of potential materials to use for the gate layer includes ruthenium (Ru), tantalum nitride (TaN), titanium nitride (TiN), and tungsten (W), tungsten nitride (VVN), titanium carbide (TiC), gallium (Ga), gadolinium (Gd), titanium oxynitride (TION), tantalum silicon nitride (TaSiN), titanium silicon nitride (TiSiN), molybdenum (Mo), aluminum (Al), copper (Cu), and combinations/stacks/alloys of these or similar materials.

After forming the one or more transistor structures in one or more corresponding sub-stacks, an additional sub-stack may be formed that includes alternating conductive and non-conductive layers, forming a memory structure. As shown in the cross-sectional view 102, the memory structure includes alternating layers of the dielectric 106 and a conductive layer 114 (shown as "Metal 3" in the legend). The conductive layers 114 may be different materials than the S/D layers 108A-D or the gate layers 112A-B. The conductive layers 114 may include any type of conductive material, including copper, gold, silver, platinum, nickel, tungsten, ruthenium, or other types of conductive metals or alloys. In some implementations, the conductive layers 114 may include TaN, TiN, W, WN, TIC, Ga, Gd, TION, TaSIN, TiSiN, Mo, Al, Cu, or combinations, stacks, or alloys of these or similar materials. These alternating layers of the dielectric layers 106 and the conductive layers 114 collectively form a memory structure.

Additional transistor sub-stacks can be formed above the memory structure in the stack of layers. As shown, a third S/D layer 108C can be formed in the stack on the upper-most (e.g., starting at the base layer) dielectric layer 106. As above, a dielectric layer 110C can then be formed on the third S/D layer 108C, which can separate the third S/D layer 108C from the gate layer 112B. One or more dielectric layers 110D can be formed on the gate layer 112B, and then a fourth S/D layer 108D can be formed on the dielectric layer 110. After forming the transistor structure on the memory structure, a cap layer 116 (shown as "Dielectric 3" in the legend) may be formed. The cap layer 116 can be any type of dielectric or other non-conductive material and may serve to protect the underlying layers from the external environment. In some implementations, one or more additional transistor structures (e.g., a deselect transistor, additional logic, etc.) may be formed (e.g., using techniques similar to those described above) on the transistor structure prior to forming the cap layer 116. Although only two transistor structures and one memory structure are shown here, it should be understood that the stack of layers can be formed to define any number of transistor structures or memory structures.

When forming each of the layers, layers that make up the transistor structures or memory structures may be patterned as is well understood in the art to form electrical connections between transistor structures or the memory structures. These connections may be formed by patterning the conductive layers described herein, as well as by forming vias to electrically connect different layers. As such, transistor structures and memory structures that are isolated in the x-y plane may be electrically connected with one another to form logical or electronic circuits. Although the memory structure is shown as including six alternating layers of conductive layers 114 and dielectric layers 106, it should be understood that any number of alternating conductive layers 114 and dielectric layers 106 may be utilized, and only a few layers are shown here for ease of visualization. For example, the memory structure may include dozens or hundreds of alternating conductive layers 114 and dielectric layers 106.

Figure 2:
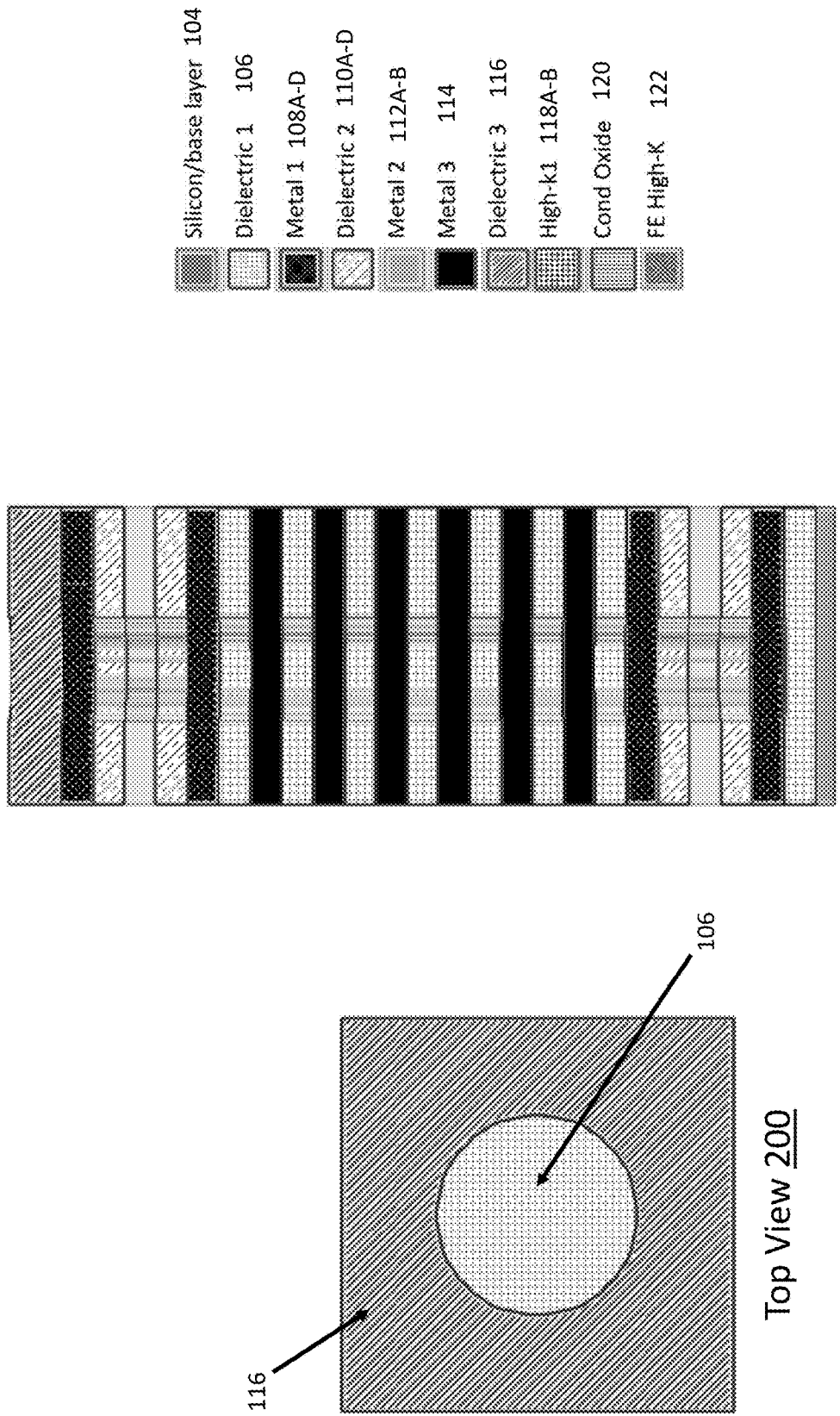

Referring to FIG. 2, illustrated is a top view 200 and a cross-sectional view 202 of the device at the next stage in the first process flow. As shown, a channel opening can be formed in the stack of layers by performing an etching process. To form the channels, a mask (e.g., of a photoresist or other suitable masking material, not shown) may be formed over the cap layer 116, with openings that define the x-y cross-section of the channels (shown here as a circle in the top view 200). One or more etch techniques may be performed to remove the portion of the underlying layers aligned with the opening in the mask to form the transistor body opening. Any type of suitable etching techniques may be used, including but not limited to dry etching, wet etching, or plasma etching techniques. The mask may be removed once the channel openings are defined or may be retained to protect the underlying surface or to remain as part of the final structure. The etching process may be performed down to the first dielectric layer 106, which may serve as an etch stop layer. In some implementations, the etching process may be performed through all of the layers down to the base layer 104.

Figure 3:
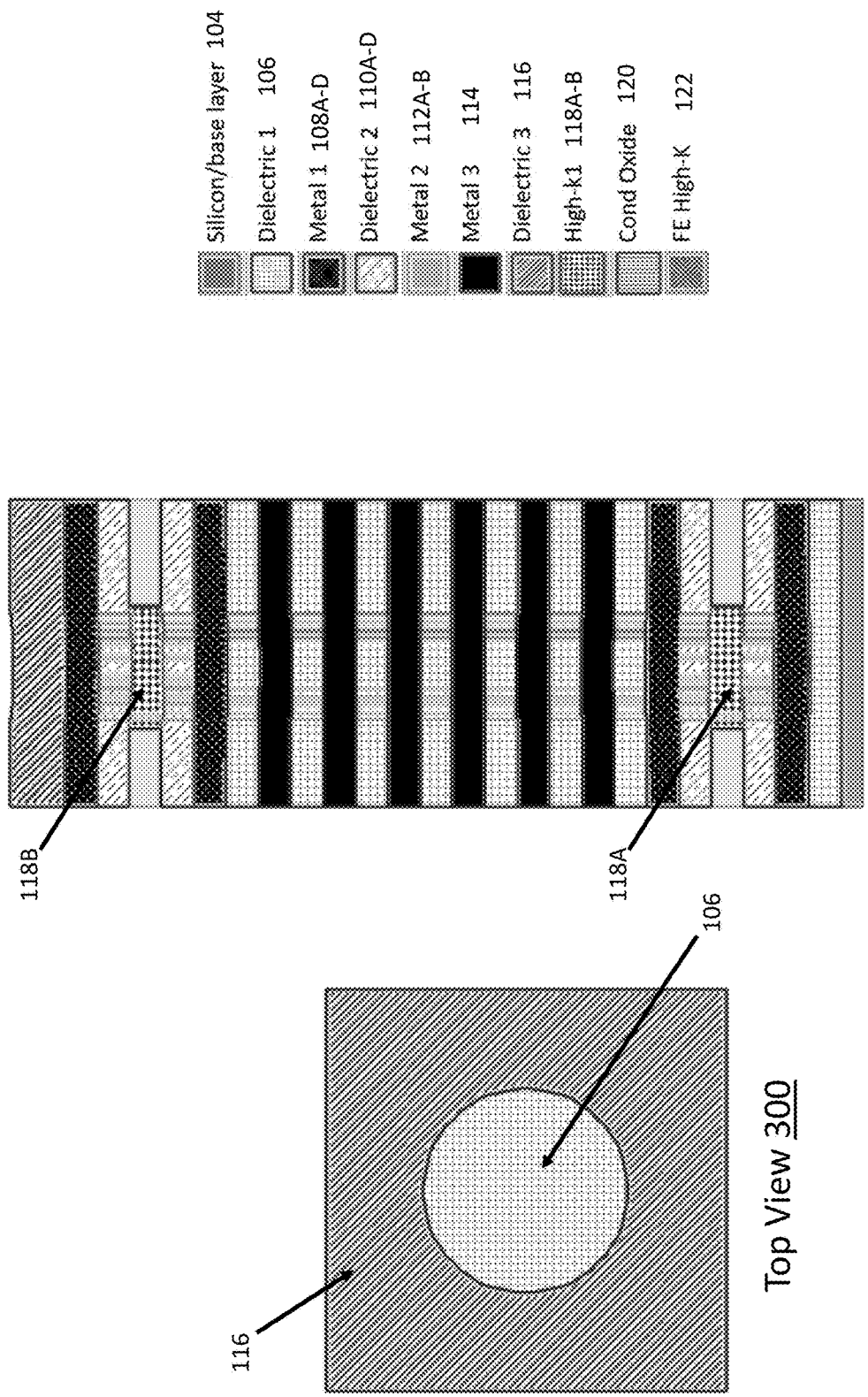

Referring to FIG. 3, illustrated is a top view 300 and a cross-sectional view 302 of the device at the next stage in the first process flow. Once the channel opening(s) are defined, one or more of the gate layers 112A-B may be etched slightly in the x-y direction (e.g., outward from the center of the transistor body opening) to recess the gate from the channel. The etching process may be a selective etching process that etches the gate layers 112A-B to create recessed regions of a predetermined volume by etching the gate layers 112A-B (the gate metal) by a predetermined amount. A gate dielectric, such as a high-k dielectric 118A-B (shown as "High-k1" in the legend and sometimes generally or individually referred to as the "high-k dielectric 118"), may be selectively formed on the gate layers 112A-B. The high-k dielectric 118 can be grown or deposited such that a predetermined amount of high-k dielectric 118 fills the recessed region of the gate layers 112A-B. Additionally or alternatively, the high-k dielectric 118 may be formed on recessed or non-recessed gate layers 112A-B so as to extend into the channel opening. The high-k dielectric 118 material may be selected to have desired attributes or properties, such as a desired dielectric constant. Likewise, the high-k dielectric 118 may be grown to create a predetermined separation distance between the gate layers 112A-B and the central channel of the transistor structure.

The high-k dielectric 118 can be any type of material that has a relatively large dielectric constant. As one example, a silicon oxide based gate dielectric such as silicon dioxide ($SiO_2$) may be selectively formed on a gate layer of silicon. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The resulting gate dielectric may be formed (or formed and then etched) to be slightly recessed, flush or slightly protruding relative to the channel opening depending on the desired device characteristics and process parameters. If multiple devices, such as N-type and P-type devices, are exposed in the opening, suitable dielectrics and thicknesses may be provided to each gate to achieve the desired characteristics. Deposition control may be achieved using specific materials for each gate layer and selecting a particular type of gate dielectric to form selectively on that gate layer.

Figure 4:
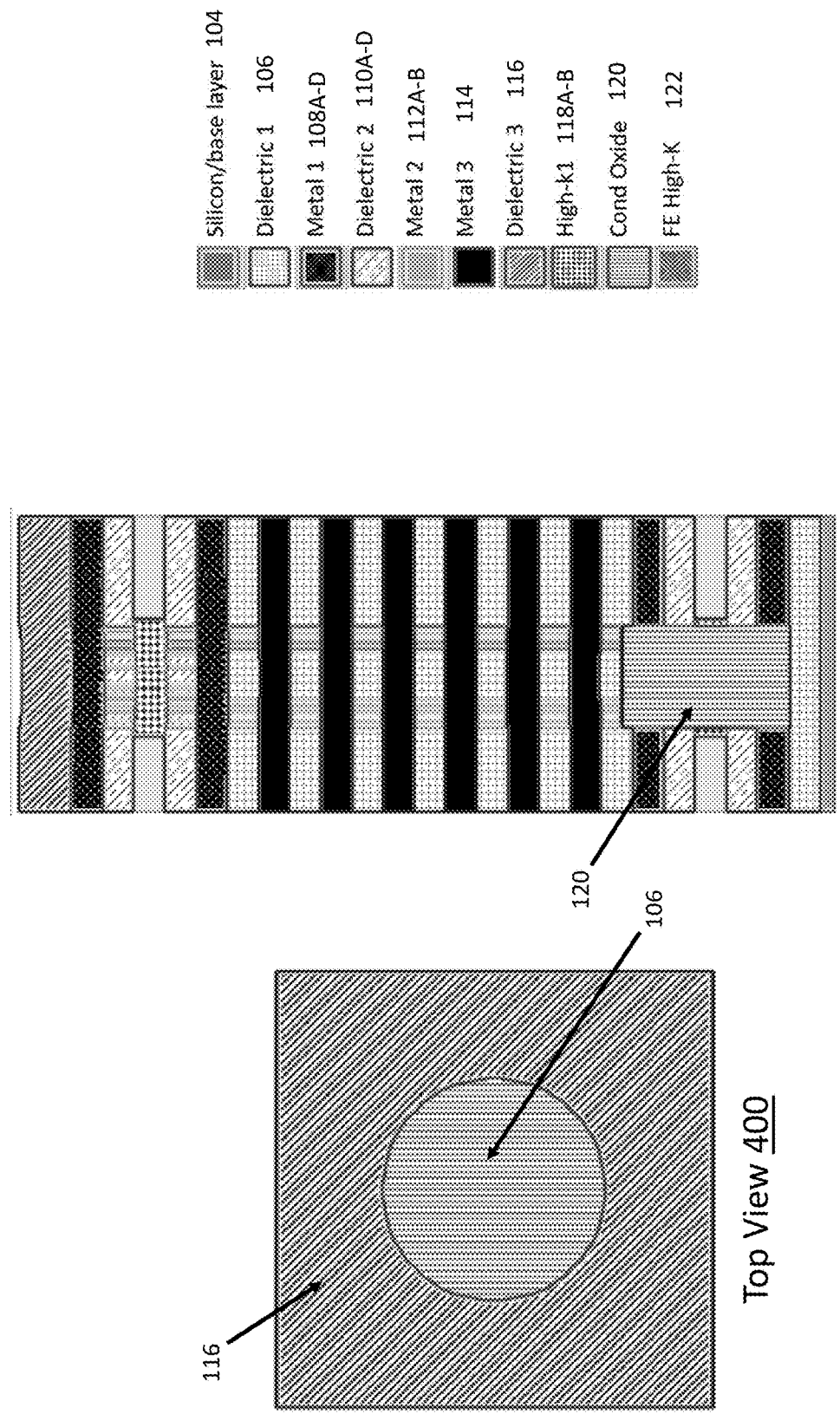

Referring to FIG. 4, illustrated is a top view 400 and a cross-sectional view 402 of the device at the next stage in the first process flow. As shown, the channel opening can be deposit filled with a layer of material, such as a semiconductive-behaving material 120 (e.g., shown as "Cond Oxide" in the legend, and sometimes referred to herein as a "deposited material"). The deposited material 120 can be any type of conductive oxide material with semiconductive properties. Although the example embodiments may show or describe the deposited material as a semiconductive-behaving material, the deposited material may be a conductive oxide, a 2D material, or other similar material and combinations thereof. The semiconductive-behaving material 120 may be formed using certain elements that, when combined with oxygen, form a new material that exhibits semiconductive behavior. For example, the material can be "turned off" with a low off state leakage current or can be "turned on" and become highly conductive when voltage is applied. For example, the semiconductive-behaving material 120 may be an N-type (e.g., N+) conductive oxide, such as $In_2O_3$, $SnO_2$, InGaZnO, and ZnO, among others. Alternatively, the semiconductive-behaving material 120 may be a P-type conductive oxide, such as SnO.

Following the deposition of the semiconductive-behaving material 120, the semiconductive-behaving material 120 may be selectively etched to a predetermined height to define a first transistor device. In some implementations, the semiconductive-behaving material 120 may be formed such that the height of the semiconductive-behaving material 120 in the channel opening is aligned with the position of the uppermost S/D layer 108D (in the z-direction) of the first transistor structure. In some implementations, the semiconductive-behaving material 120 may be selectively grown on the first transistor structure in the channel opening. This may form a donut or ring-shaped channel cylinder that is defined on its outermost edge by the channel opening and, if applicable, the gate dielectric layers 118A-B.

Various parameters (e.g., thickness or shape of one or more S/D layers 108A-D, thickness or shape of one or more layers of the gate layers 112A-B, thickness or shape of one or more layers, thickness or shape of the high-k dielectric 118, thickness or shape of the layers of dielectric 106 or the dielectric 110A-D, the diameter of the central channel, etc.) may be selected prior to the fabrication process to create transistors with desired properties. It should also be appreciated that other materials may be used for the central channel, such as a 2D material or epitaxial material. In the case of an epitaxial layer, the channel opening etch will reach completely to the base layer 104, which in such an embodiment would be a semiconductor such as silicon. Then, a first layer of material, e.g., SiGe, would be formed followed by the growth of the channel. The SiGe material would subsequently be removed and/or replaced by an isolation material (not shown). Additionally or alternatively, one or more of the channel materials may include an epitaxially grown or polycrystalline deposited semiconductor, such as Si, Ge, or GaAs, among others.

Referring to FIG. 5, illustrated is a top view 500 and a cross-sectional view 502 of the device at the next stage in the first process flow. At this stage in the process flow, a second high-k dielectric 122 (shown as "FE High-K" in the legend) is deposited in the channel opening using a material deposition technique, such as an ALD. The second high-k dielectric 122 may operate as a charge trap layer for the memory structure in the final device. The second high-k dielectric 122 may be any type of suitable dielectric charge trap material, such as HZO (e.g., $Hf_xZr_{1-x}O$). As shown, the initial deposition of the second high-k dielectric 122 can be provided in the entirety of the channel opening and may also cover portions of the cap layer 116. The dielectric constant (k) of the second high-k dielectric 122 may be different from the dielectric constant of the high-k dielectric 118.

Figure 6:
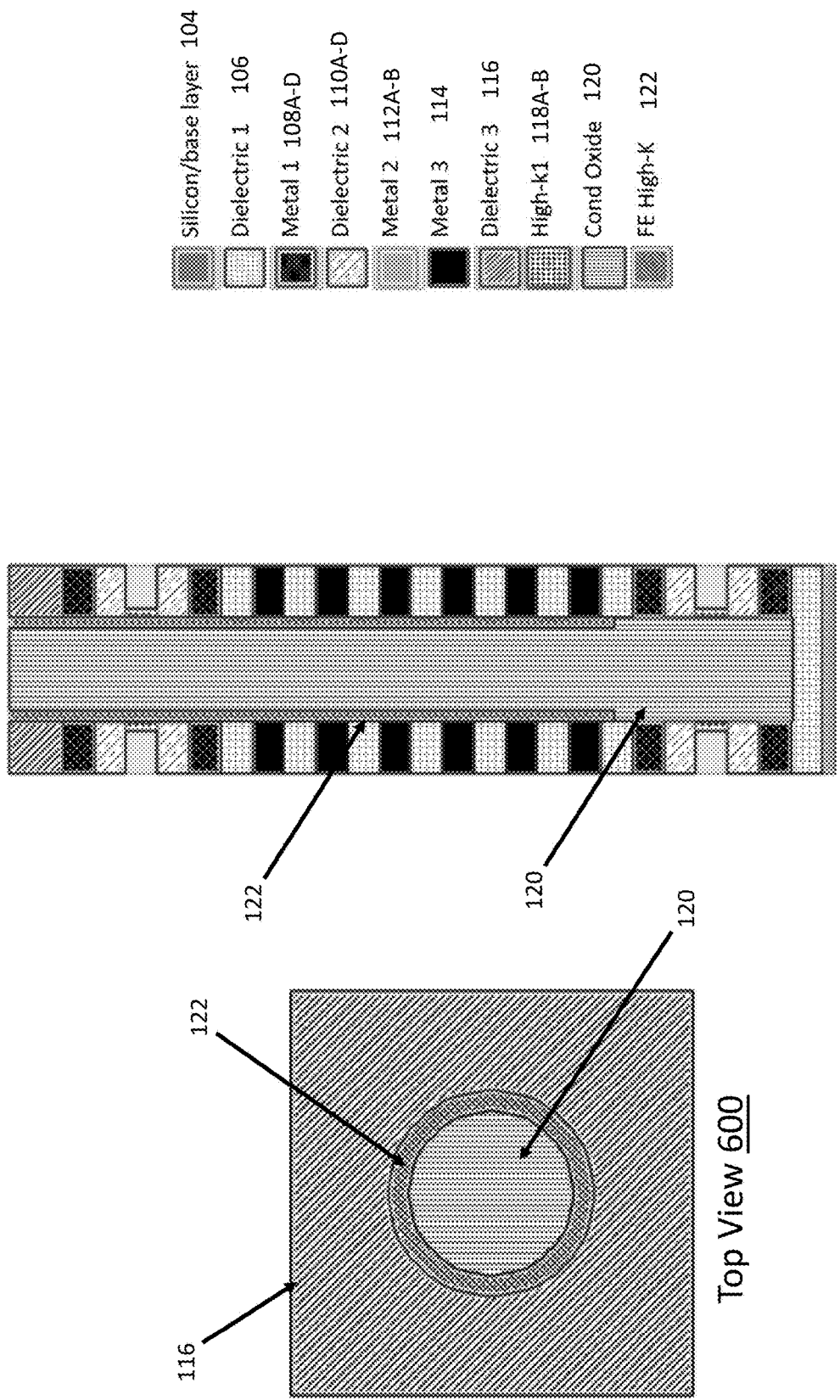

Referring to FIG. 6, illustrated is a top view 600 and a cross-sectional view 602 of the device at the next stage in the first process flow. At this stage in the process flow, the layer of the second high-k dielectric 122 deposited in the previous stage may be vertically or otherwise selectively etched to form a layer of the second high-k dielectric 122 that is in contact only with the side-walls of the channel opening. As shown in both the top view 600 and the cross-sectional view 602, the second high-k dielectric 122 is now a thin layer in the channel opening and is aligned with both the memory structure and the second transistor structure positioned on top of the memory structure. Any type of suitable etching techniques may be used, including but not limited to dry etching, wet etching, or plasma etching techniques. After the second high-k dielectric 122 has been etched, the semiconductive behaving material 120 can be deposited to fill the channel opening. Any suitable material deposition technique can be used to deposit the semiconductive behaving material 120, including ALD, CVD, PVD, or plasma-enhanced techniques, among others. In some implementations, after depositing the semiconductive-behaving material 120, a chemical mechanical polish (CMP) process may be performed to planarize the surface of the device.

Referring to FIG. 7, illustrated is a top view 700 and a cross-sectional view 702 of the device at the next stage in the first process flow. At this stage in the process flow, the layer of the second high-k dielectric 122 on the sidewalls of the channel opening may be vertically or otherwise selectively etched, to form an air gap between the semiconductive-behaving material 120 and the layers of the second transistor structure. The second high-k dielectric 122 may be etched such that the second high-k dielectric 122 is aligned only with the memory structure (e.g., etching by a predetermined amount). Any type of suitable etching techniques may be used, including but not limited to dry etching, wet etching, or plasma etching techniques.

Figure 8:
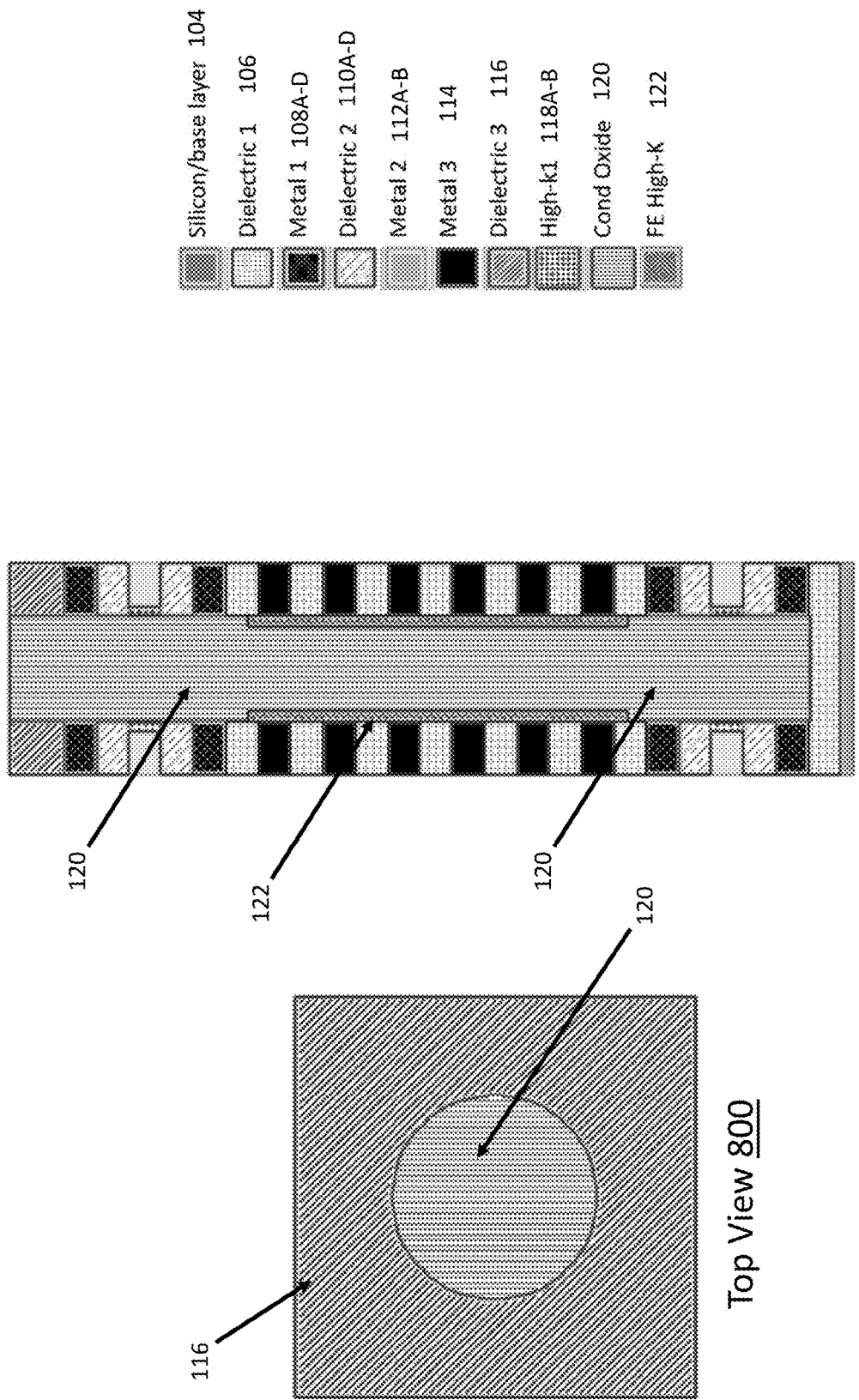

Referring to FIG. 8, illustrated is a top view 800 and a cross-sectional view 802 of the device at the next stage in the first process flow. At this stage, the air gaps created by etching the second high-k dielectric 122 can be deposit-filled with the semiconductive-behaving material 120. This allows the semiconductive-behaving material 120 formed at the center of the channel opening to contact the layers of the second transistor structure, effectively forming a second transistor device. In addition, the deposition of the semiconductive-behaving material 120 encapsulates the second high-k dielectric 122 in the channel opening. In some implementations, after depositing the semiconductive-behaving material 120, a CMP process may be performed to planarize the surface of the device.

Referring to FIG. 9, illustrated is a top view 900 and a cross-sectional view 902 of the device at the next stage in the first process flow. At this stage, the semiconductive-behaving material 120 is directionally etched using a suitable etching technique to recess the semiconductive-behaving material 120 to slightly above the fourth S/D layer 108D. This creates a small trench near the top of the device in the previously formed channel opening. Any type of suitable etching techniques may be used, including but not limited to dry etching, wet etching, or plasma etching techniques. After etching the semiconductive-behaving material 120, a layer of the dielectric 106 can be deposited in the opening with a thickness that is less than the depth of the trench formed in the semiconductive-behaving material 120. This creates a self-aligned etching mask, which is used to define a core opening in the semiconductive-behaving material 120 in further process steps. As shown, the thickness of the deposited dielectric material 106 can determine the diameter of the core opening, and therefore the thickness of the deposited dielectric material 106 may be predetermined to achieve desired device characteristics. The dielectric material 106 can be deposited using any suitable material deposition techniques, including ALD, CVD, PVD, or plasma-enhanced techniques, among others.

Referring to FIG. 10, illustrated is a top view 1000 and a cross-sectional view 1002 of the device at the next stage in the first process flow. At this stage, the dielectric material 106 deposited in the previous stage can be directionally etched (e.g., toward the base layer 104) to form a self-aligned space (e.g., due to the geometry of the dielectric material 106 when deposited in the trench). Then, the semiconductive-behaving material 120 can be selectively etched down to the dielectric layer 106 formed on the base layer, to form the core opening through the device. In some implementations, the etching process may be performed through the dielectric layer 106, such that the base layer 104 acts as an etch stop layer. As shown, a small portion of the dielectric material 106 may remain in the trench near the top of the device around the core opening defined in the semiconductive behaving material 120.

Referring to FIG. 11, illustrated is a top view 1100 and a cross-sectional view 1102 of the device at the next stage in the first process flow. At this stage in the process flow, the core opening and, if applicable, the trench previously formed at the top of the device, can be deposit-filled with the dielectric material 106. The dielectric material 106 may be deposited or otherwise formed using any suitable deposition technique. By defining a core region of dielectric material 106 in the transistor, the overall volume of the semiconductive-behaving material 120 is reduced, thereby changing the electronic characteristics of the resulting transistor devices and memory devices. For example, when the volume of the semiconductive-behaving materials 120 is reduced, the amount of energy required to turn the transistor to an "on" state is also reduced. The size of the core area etched through the semiconductive-behaving materials can be selected (e.g., by way of selecting the thickness of the self-aligning layer of the dielectric 106 in previous process steps) to achieve desired transistor characteristics. Alternatively, the core opening may be left empty to leave an air gap (not shown). If an air gap is desired, the core area may be sealed at the uppermost end of the structure with a capping material (e.g., any of the dielectric materials 106, 110, or 116) to prevent unwanted debris, liquid, moisture, or other material from entering the gap and potentially affecting the devices. A CMP process may then be used to planarize the surface of the stack following the deposition of the dielectric 106 (or formation of the capping material, if an air gap is formed).

Figure 12:
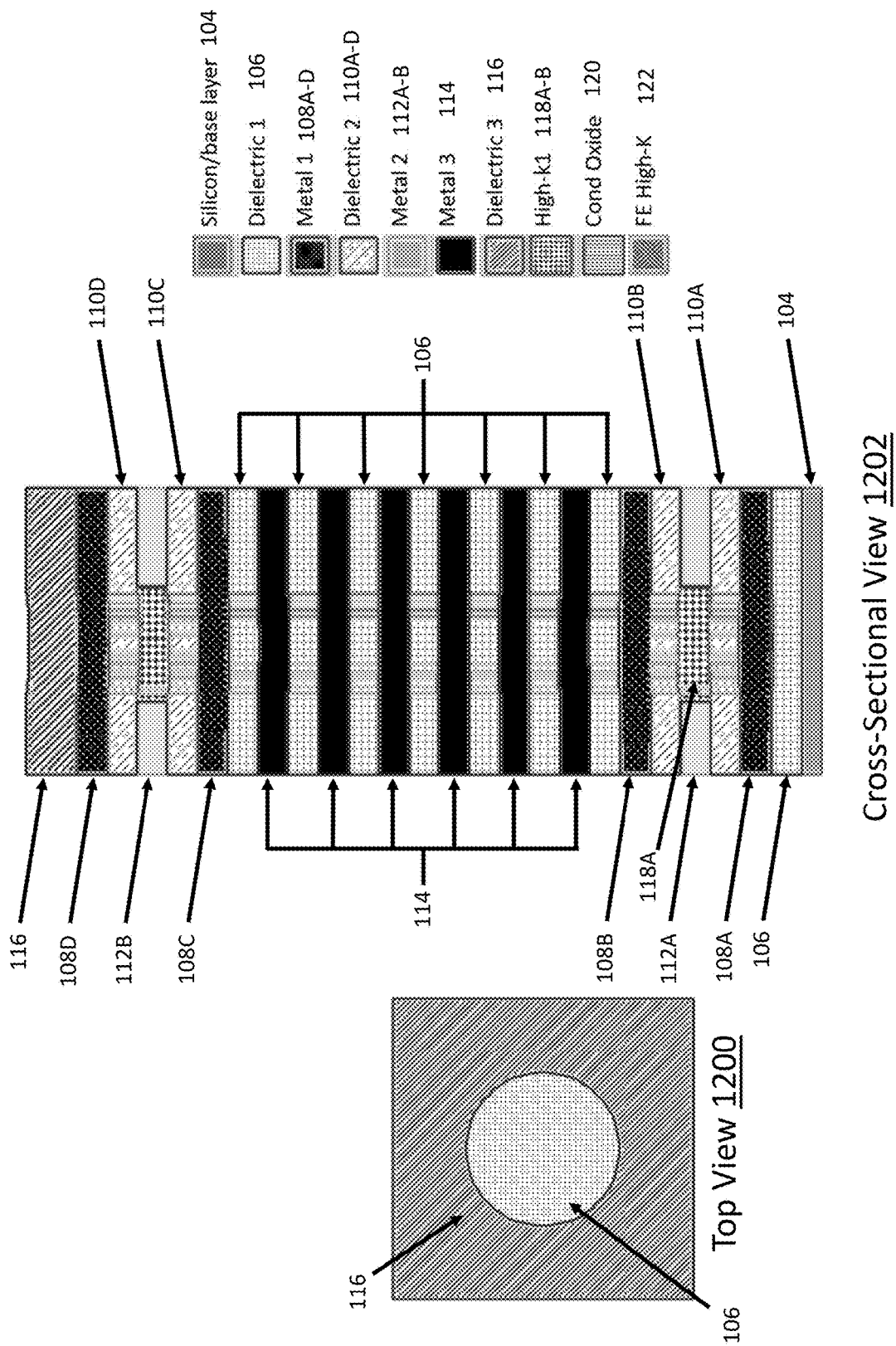

FIGS. 12-16 show cross-sectional views of a second process flow to form 3D memory structures with conductive dielectric channels integrated with vertical access transistors, according to an embodiment. Referring to FIG. 12, illustrated is a top view 1200 and a cross-sectional view 1202 of a device at the first stage in the second process flow. As shown, a stack of layers is formed using techniques that are similar to those described in connection with FIG. 1, and a channel opening is formed in the stack of layers using techniques similar to those described in connection with FIG. 2. Then, high-k dielectric materials may be formed as gate dielectrics on the gate layers 112A-B by using techniques similar to those described in connection with FIG. 3.

Referring to FIG. 13, illustrated is a top view 1300 and a cross-sectional view 1302 of a device at the next stage in the second process flow. At this stage in the process flow, one or more of the conductive layers 114 in the memory structure may be etched slightly in the x-y direction (e.g., outward from the center of the transistor body opening) to recess the conductive layers 114 from the channel. The etching process may be a selective etching process that etches the conductive layers 114 to create recessed regions of a predetermined volume by etching the conductive layers 114 (the gate metal in the memory structure) by a predetermined amount. Then, the second high-k dielectric 122 can be selectively formed on the conductive layers 114 in the recessed opening creating with the foregoing etching process. The second high-k dielectric 122 can be grown or deposited such that a predetermined amount of the second high-k dielectric 122 fills the recessed region of the conductive layers 114. The second high-k dielectric 122 material may be selected to have desired attributes or properties, such as a desired dielectric constant. Likewise, the second high-k dielectric 122 may be grown to create a predetermined separation distance between the conductive layers 114 and the central channel of the memory structure. The second high-k dielectric 122 may be any type of suitable dielectric charge trap material, such as HZO (e.g., $Hf_xZr_{1-x}O$).

Figure 14:
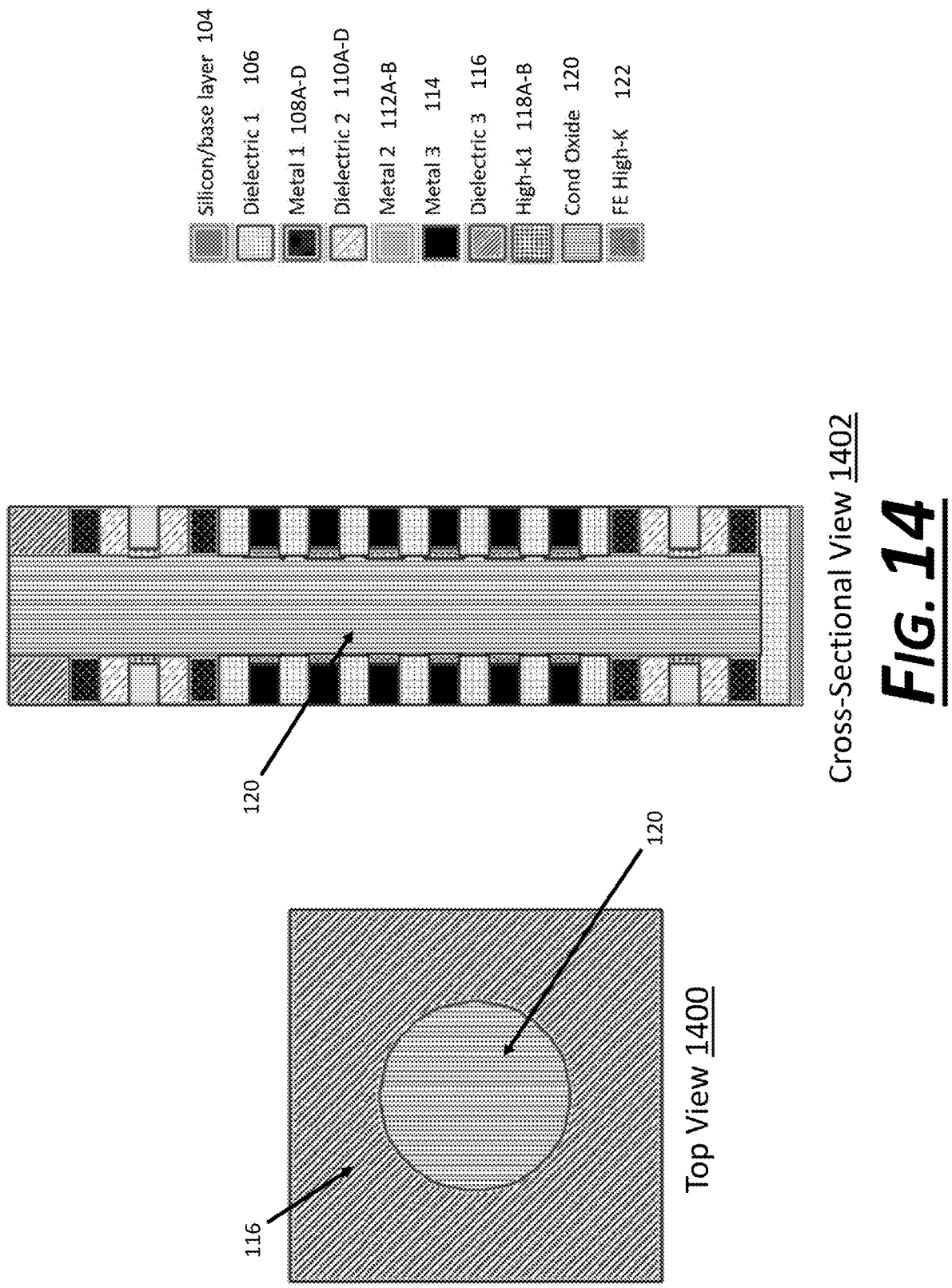

Referring to FIG. 14, illustrated is a top view 1400 and a cross-sectional view 1402 of a device at the next stage in the second process flow. After forming the second high-k dielectrics 122 on the conductive layers 114 of the memory structure, the channel opening can be deposit-filled with the semiconductive-behaving material 120. As described above, the semiconductive-behaving material 120 may be formed using certain elements that, when combined with oxygen, form a new material that exhibits semiconductive behavior. For example, the material can be "turned off" with a low off state leakage current or can be "turned on" and become highly conductive when voltage is applied. For example, the semiconductive-behaving material 120 may be an N-type (e.g., N+) conductive oxide, such as $In_2O_3$, $SnO_2$, InGaZnO, and ZnO, among others. Alternatively, the semiconductive-behaving material 120 may be a P-type conductive oxide, such as SnO.

Referring to FIG. 15, illustrated is a top view 1500 and a cross-sectional view 1502 of a device at the next stage in the second process flow. At this stage in the process flow, a core opening may be defined using techniques similar to those described above in connection with FIGS. 9 and 10. To form the core opening, the semiconductive-behaving material 120 can be partially etched to form a trench, and a layer (of a predetermined thickness) of the dielectric material 106 can be deposited in the trench. The dielectric material 106 deposited in the trench may then be directionally etched to create a self-aligned opening that defines the diameter of the core opening, and the core opening can then be formed by directionally etching the semiconductive-behaving material 120 down to an etch stop layer (e.g., the first layer of the dielectric 106 or the base layer 104). As described above, the diameter of the core channel defined in the semiconductive-behaving material 120 may be predetermined in part based on the thickness of the dielectric layer 106 deposited in the trench formed near the top of the device.

Referring to FIG. 16, illustrated is a top view 1600 and a cross-sectional view 1602 of a device at the next stage in the second process flow. At this stage in the process flow, the core opening and, if applicable, the trench previously formed at the top of the device, can be deposit-filled with the dielectric material 106. The dielectric material 106 may be deposited or otherwise formed using any suitable deposition technique (e.g., similar to those described in connection with FIG. 11). Alternatively, the core opening may be left empty to leave an air gap (not shown). If an air gap is desired, the core area may be sealed at the uppermost end of the structure with a capping material (e.g., any of the dielectric materials 106, 110A-D, or 116) to prevent unwanted debris, liquid, moisture, or other material from entering the gap and potentially affecting the devices. A CMP process may then be used to planarize the surface of the stack following the deposition of the dielectric 106 (or formation of the capping material, if an air gap is formed).

FIGS. 17-25 show cross-sectional views of a third process flow to form 3D memory structures with conductive dielectric channels integrated with vertical access transistors, according to an embodiment. Referring to FIG. 17, illustrated is a top view 1700 and a cross-sectional view 1702 of a device at the first stage in the third process flow. The third process flow is an alternative process flow that begins following the first process flow up to and including the step described in connection with FIG. 4. As shown, the stack of layers has been formed, a channel opening has been defined in the stack of layers, high-k dielectrics 118A-B have been formed on the gate layers 112A-B in the channel opening, and a semiconductive-behaving material has been deposited such that it is aligned with the first transistor structure. Then, a layer of the dielectric material 124 (shown as the "Dielectric 4" in the legend) is deposited in the channel opening. The dielectric material 124 can be deposited using any suitable material deposition technique, such as an ALD process. The thickness of the dielectric material 124 can be predetermined, as it determines the diameter of an inner core dielectric that will be formed in the semiconductive-behaving material 120 in later process steps.

Figure 18:
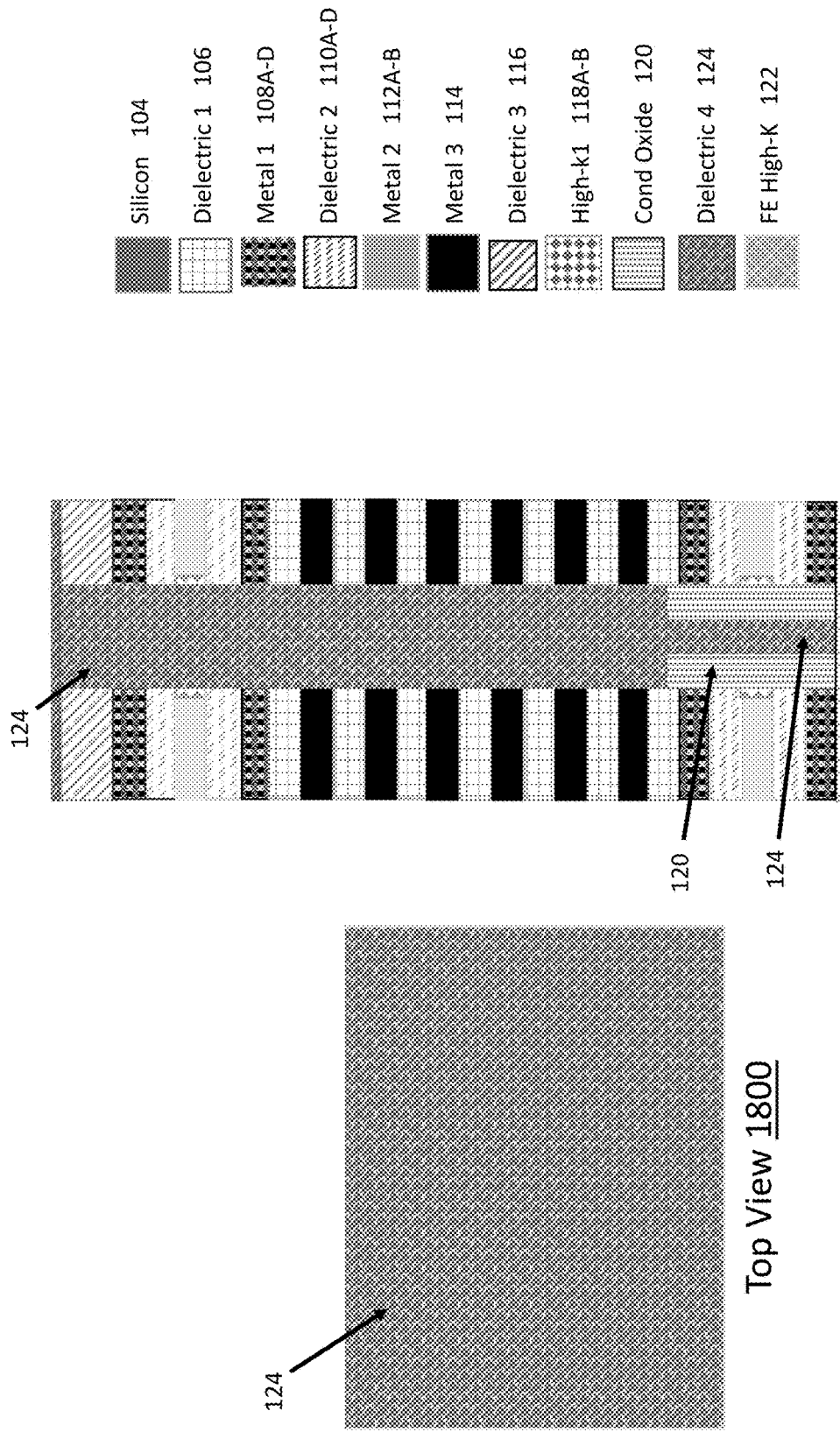

Referring to FIG. 18, illustrated is a top view 1800 and a cross-sectional view 1802 of a device at the next stage in the third process flow. At this stage in the process flow, the self-aligned opening in the dielectric material 124 can be used to etch an inner core opening in the semiconductive behaving material 120. To do so, any suitable direction etching technique may be used, including but not limited to dry etching, wet etching, or plasma etching techniques. Once the inner core opening has been formed in the semiconductive-behaving material 120, the dielectric material 124 can be deposited in the inner core opening to fill the channel opening. Any suitable material deposition technique may be used to provide the dielectric material 124, including an ALD process, a CVD process, a PVD process, or plasma-enhanced techniques. In some implementations, after filling the core region with the dielectric material 124, a CMP process can be performed.

Referring to FIG. 19, illustrated is a top view 1900 and a cross-sectional view 1902 of a device at the next stage in the third process flow. At this stage in the process flow, the dielectric material 124 deposited in the channel opening formed above the semiconductive-behaving material 120 can be directionally etched and removed. The inner core dielectric 124 can remain in the center of the semiconductive behaving material 120, and following the etching process, the semiconductive-behaving material 120 can remain exposed in the channel opening. Any suitable etching technique may be used to remove the dielectric 124, including but not limited to dry etching, wet etching, or plasma etching techniques. The etching process may be selective to the dielectric material 124. The semiconductive-behaving material 120 can act as an etch stop material.

Figure 20:
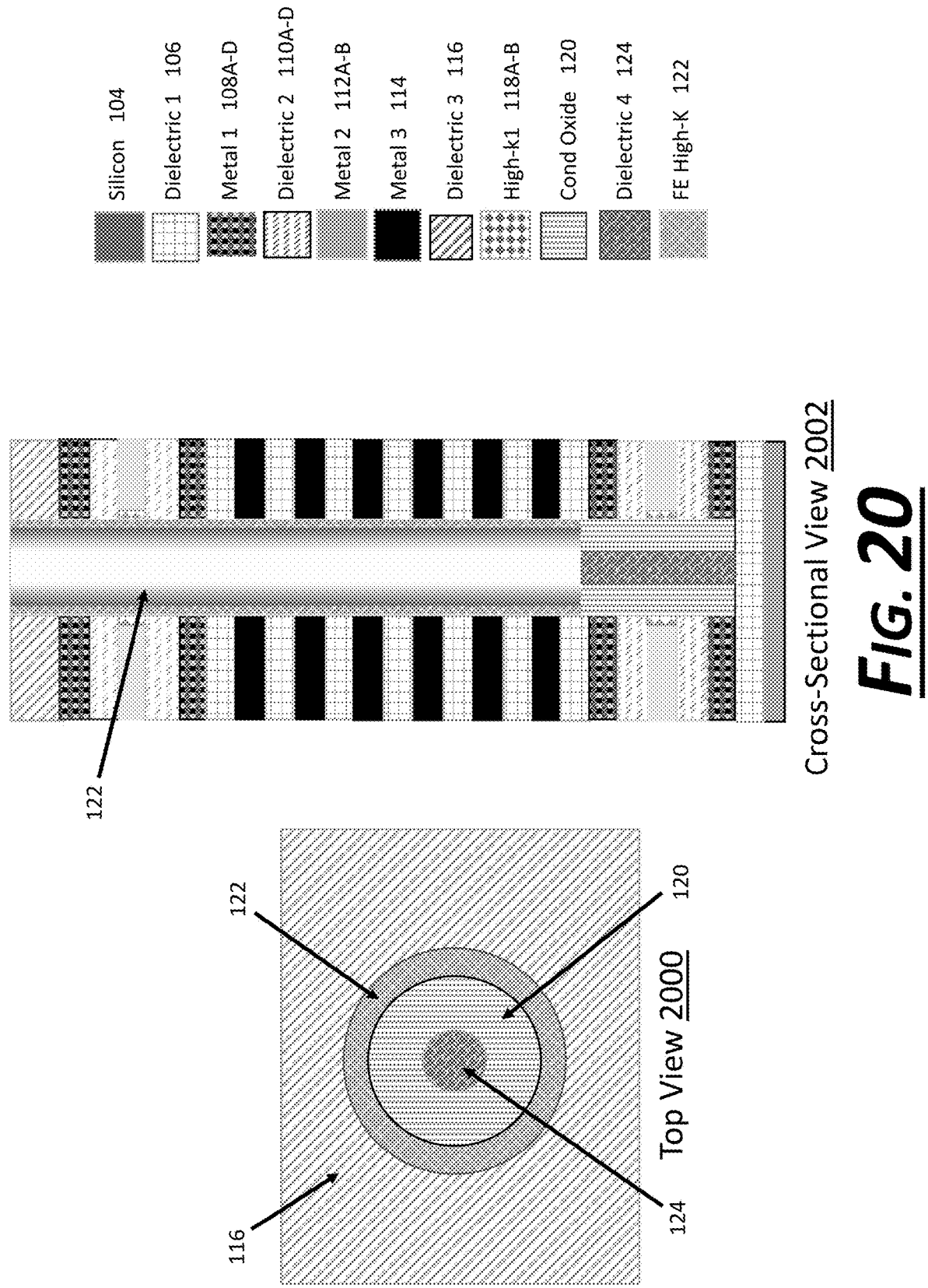

Referring to FIG. 20, illustrated is a top view 2000 and a cross-sectional view 2002 of a device at the next stage in the third process flow. At this stage in the process flow, a second high-k dielectric 122 is deposited in the channel opening using a material deposition technique, such as an ALD. The second high-k dielectric 122 may operate as a charge trap layer for the memory structure in the final device. The second high-k dielectric 122 may be any type of suitable dielectric charge trap material, such as HZO (e.g., $Hf_xZr_{1-x}O$). The initial deposition of the second high-k dielectric 122 can be provided in the entirety of the channel opening and may also cover portions of the cap layer 116. The dielectric constant (k) of the second high-k dielectric 122 may be different from the dielectric constant of the high-k dielectric 118. Once the second high-k dielectric 122 is deposited, a directional etch can remove portions of the second high-k dielectric 122 on the cap layer 116, the semiconductive-behaving material 120, and the dielectric material 124. Following the etching process, the second high-k dielectric 122 can remain on the surface of the channel opening, such that the second high-k dielectric 122 is aligned with the memory structure and the second transistor structure.

Figure 21:
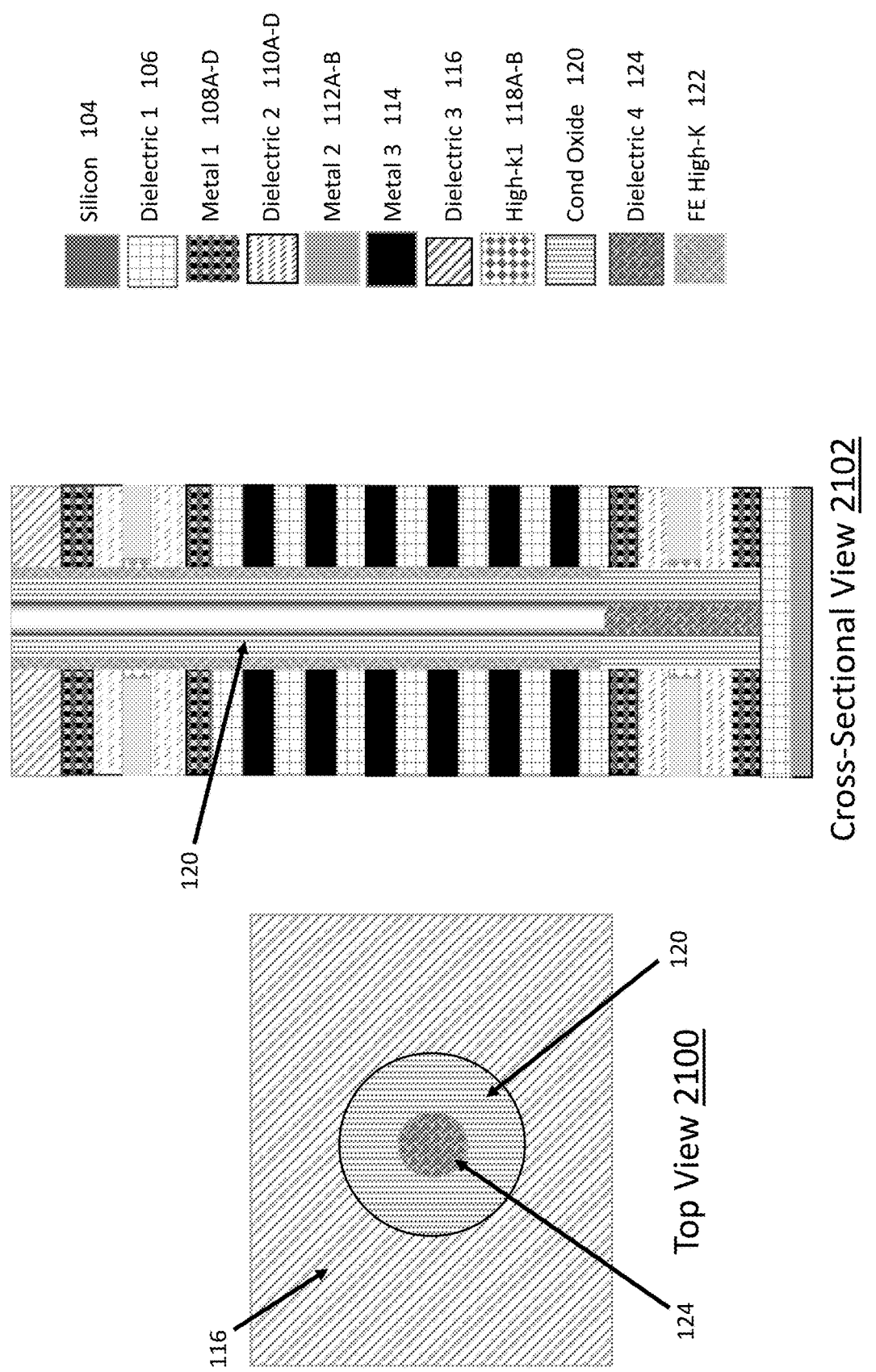

Referring to FIG. 21, illustrated is a top view 2100 and a cross-sectional view 2102 of a device at the next stage in the third process flow. At this stage in the process flow, the semiconductive behaving material 120 can be deposited in the channel opening on the second high-k dielectric 122, as shown. Any suitable material deposition technique may be used to provide the semiconductive behaving material 120 in the channel opening, including but not limited to ALD processes, CVD processes, PVD processes, and plasma-enhanced processes, among others. The semiconductive behaving material 120 can be deposited to form a core opening in the channel opening, by depositing a layer of the semiconductive behaving material 120 at a predetermined thickness in the channel opening. A directional etching process can then be used to remove excess material, and to expose the dielectric material 124 that forms the inner core of the semiconductive behaving material 120 aligned with the first transistor structure. The semiconductive behaving material 120 can be deposited and etched such that the core opening is substantially the same diameter as the dielectric material 124 in the inner core of the first transistor device, as shown.

Figure 22:
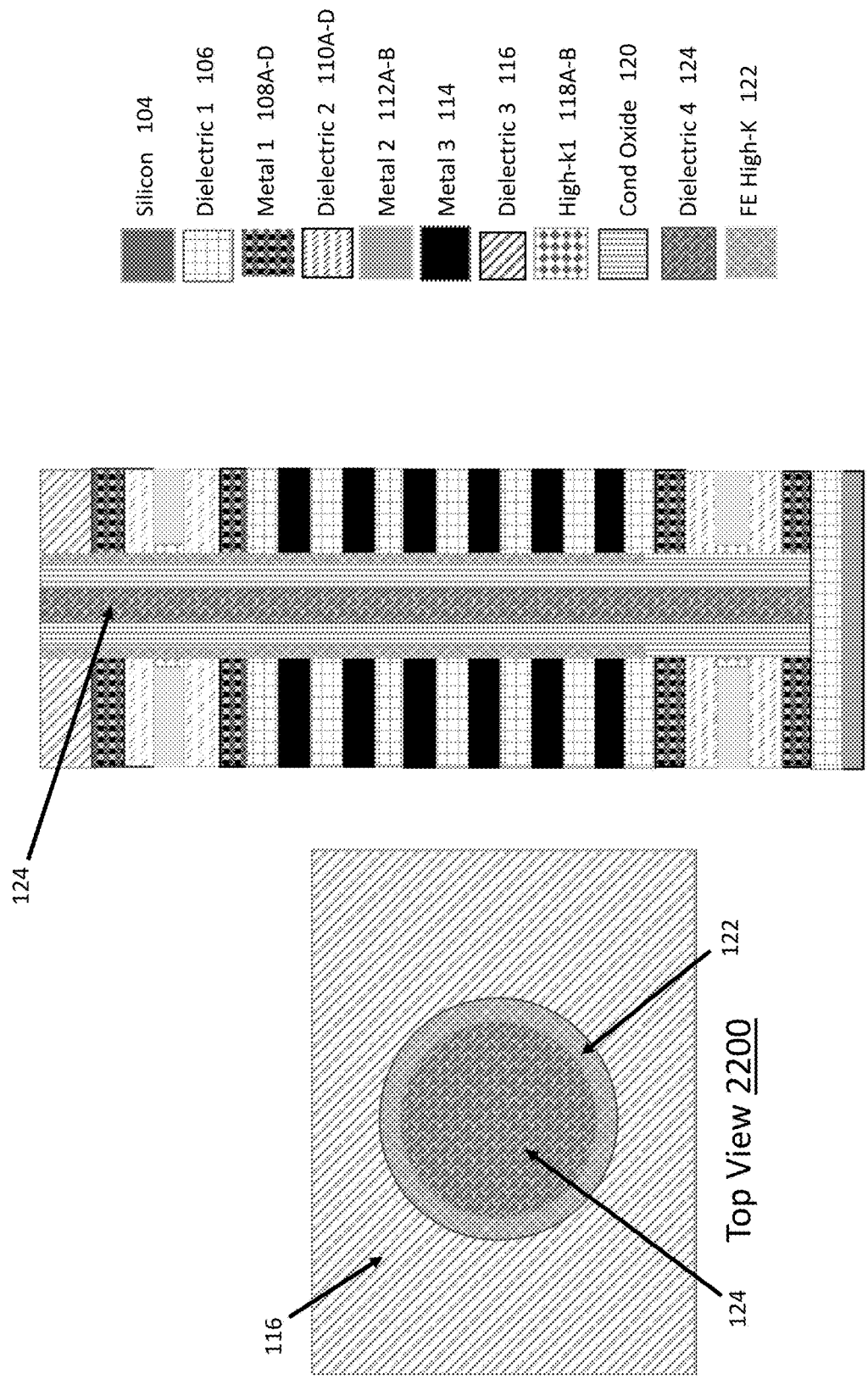

Referring to FIG. 22, illustrated is a top view 2200 and a cross-sectional view 2202 of a device at the next stage in the third process flow. At this stage in the process flow, the dielectric material 124 can be deposited to fill the core opening in the semiconductive-behaving material 120 created in the previous step. The dielectric material 124 may be deposited or otherwise formed using any suitable deposition technique, such as ALD, CVD, PVD, or plasma-enhanced techniques. Alternatively, the core opening may be left empty to leave an air gap (not shown). If an air gap is desired, the core area may be sealed at the uppermost end of the structure with a capping material (e.g., any of the dielectric materials 106, 110A-D, 116, or 124) to prevent unwanted debris, liquid, moisture, or other material from entering the gap and potentially affecting the devices. A CMP process may then be used to planarize the surface of the stack following the deposition of the dielectric 124 (or formation of the capping material, if an air gap is formed).

Referring to FIG. 23, illustrated is a top view 2300 and a cross-sectional view 2302 of a device at the next stage in the third process flow. At this stage in the process flow, the layer of the second high-k dielectric 122 on the sidewalls of the channel opening may be vertically or otherwise selectively etched to form an air gap between the semiconductive-behaving material 120 and the layers of the second transistor structure. The second high-k dielectric 122 may be etched such that the second high-k dielectric 122 is aligned only with the memory structure (e.g., etching by a predetermined amount). Any type of suitable etching techniques may be used, including but not limited to dry etching, wet etching, or plasma etching techniques.

Referring to FIG. 24, illustrated is a top view 2400 and a cross-sectional view 2402 of a device at the next stage in the third process flow. At this stage, the air gaps created by etching the second high-k dielectric 122 can be deposit-filled with the semiconductive-behaving material 120. This allows the semiconductive-behaving material 120 formed in the channel opening to contact the layers of the second transistor structure, effectively forming a second transistor device. In addition, the deposition of the semiconductive-behaving material 120 encapsulates the second high-k dielectric 122 in the channel opening. In some implementations, after depositing the semiconductive-behaving material 120, a CMP process may be performed to planarize the surface of the device.

FIGS. 25-27 show flow diagrams of example methods for fabricating memory devices integrated with 3D vertical logic described in connection with FIGS. 1-24, according to an embodiment. Referring to FIG. 25, depicted is a flow diagram of a method 2500 for fabricating memory devices integrated with 3D vertical logic. The method 2500 may include steps 2505-2525. However, other embodiments may include additional or alternative steps, or may omit one or more steps altogether.

At step 2505, the method includes forming a stack of layers. To form the stack of layers, processes described herein above in connection with FIG. 1 may be performed. The stack of layers can include a first conductive source/drain layer (e.g., the first S/D layer 108A), a first gate conductive layer (e.g., the first gate layer 112A) separated from the first conductive source/drain layer by at least one dielectric layer (e.g., the dielectric layer 110A), and a second source/drain layer (e.g., the second S/D layer 108B) separated from the first gate conductive layer by at least one dielectric layer. The stack of layers can include a second sub-stack for a memory structure positioned on the first sub-stack. The second sub-stack can include at least one layer of conductive material (e.g., the conductive material 114) and at least one layer of non-conductive material (e.g., the dielectric 106). The stack of layers can include a third sub-stack for a second transistor structure. The third sub-stack can include a third conductive source/drain layer (e.g., the third S/D layer 108C), a second gate conductive layer (e.g., the second gate layer 112B) separated from the third conductive source/drain layer by at least one dielectric layer, and a fourth source/drain layer (e.g., the fourth S/D layer 108D) separated from the second gate conductive layer by at least one dielectric layer.

At step 2510, the method includes forming a channel opening in the stack of layers. To do so, processes similar to those described in connection with FIG. 2 may be performed. For example, an etching process described in connection with FIG. 2 may be used to define the channel opening through the memory structure and the transistor structure. A substrate layer (e.g., the base layer 104) may act as an etch stop layer when etching the channel opening. Defining the channel opening may include defining an opening for any number of transistor structures or memory structures, as described herein.

At step 2515, the method includes providing a first channel structure within the channel opening. The first channel structure can include a semiconductive-behaving material (e.g., the semiconductive-behaving material 120) and can be aligned with the first transistor structure. The first channel structure can be formed using processes described in connection with FIG. 4. In some implementations, the method includes forming a first gate dielectric on the first gate conductive layer prior to providing the first channel structure, as described in connection with FIG. 3. Similarly, a second gate dielectric may be formed on the second gate conductive layer of the second transistor structure using similar techniques, prior to providing the channel structures in the channel opening. The semiconductive-behaving material may be an N-type semiconductive-behaving material or a P-type semiconductive-behaving material. In some implementations, the channel structure can be formed on a seed layer. In such implementations, the channel structure may be formed using epitaxial techniques.

At step 2520, the method includes forming a memory dielectric layer (e.g., the second high-k dielectric material 122) in the channel opening and aligned with the memory structure. To form the memory dielectric layer, the processes described in connection with FIGS. 6 and 7 may be used. The memory dielectric layer may be deposited in the channel opening using material deposition techniques such as ALD and may be formed to have a predetermined thickness. The memory dielectric layer may be selectively (e.g., directionally, etc.) etched to form the memory dielectric layer on the walls of the channel opening, such that the memory dielectric layer is aligned with the memory structure in the stack of layers.

At step 2525, the method includes providing a second channel structure (e.g., the semiconductive behaving material 120) in the channel opening in contact with the memory dielectric layer and aligned with the second transistor structure. To do so, the processes described in connection with FIGS. 7 and 8 may be performed. The first channel structure and the second channel structure can be formed from the same material (e.g., the semiconductive-behaving material 120). In some implementations, the method includes forming a core channel opening through the first channel structure and the second channel structure, for example, using techniques described in connection with FIGS. 9 and 10. To form the core channel, the method can include forming a self-aligned space on the second channel structure, and forming a self-aligned dielectric in the self-aligned space, as described in connection with FIG. 9. Then, the core channel opening can be etched through the self-aligned space, the second channel structure, and the first channel structure, as described in connection with FIG. 10. A core dielectric can then be formed in the core channel opening, as described in connection with FIG. 11.

Referring to FIG. 26, depicted is a flow diagram of a method 2600 for fabricating memory devices integrated with 3D vertical logic. The method 2600 may include steps 2605-2620. However, other embodiments may include additional or alternative steps or may omit one or more steps altogether.

At step 2605, the method includes forming a stack of layers. To form the stack of layers, techniques similar to those described in connection with FIGS. 1 and 12 may be used. The stack of layers can include a first sub-stack for a first transistor structure. The first sub-stack can include a first conductive source/drain layer (e.g., the first S/D layer 108A), a first gate conductive layer (e.g., the first gate layer 112A) separated from the first conductive source/drain layer by at least one dielectric layer (e.g., the dielectric 110A), and a second source/drain layer (e.g., the second S/D layer 108B) separated from the first gate conductive layer by at least one dielectric layer (e.g., the dielectric layer 110B). The stack of layers can include a second sub-stack for a memory structure positioned on the first sub-stack. The second sub-stack can include at least one layer of conductive material (e.g., the conductive material 114) and at least one layer of non-conductive material (e.g., the dielectric material 106). The stack of layers can include a third sub-stack for a second transistor structure. The third sub-stack can include a third conductive source/drain layer (e.g., the third S/D layer 108C), a second gate conductive layer (e.g., the second gate layer 112B) separated from the third conductive source/drain layer by at least one dielectric layer (e.g., the dielectric layer 110C), and a fourth source/drain layer (e.g., the fourth S/D layer 108D) separated from the second gate conductive layer by at least one dielectric layer.

At step 2610, the method includes forming a channel opening in the stack of layers. To do so, processes similar to those described in connection with FIG. 2 or 12 may be performed. For example, an etching process described in connection with FIG. 2 may be used to define the channel opening through the memory structure and the transistor structure. A substrate layer (e.g., the base layer 104) may act as an etch stop layer when etching the channel opening. Defining the channel opening may include defining an opening for any number of transistor structures or memory structures, as described herein.

At step 2615, the method includes forming a memory gate dielectric layer (e.g., the second high-k dielectric 122) in the channel opening on the at least one layer of conductive material (e.g., the conductive layers 114) in the second sub-stack. To do so, techniques described in connection with FIG. 13 may be performed. The memory gate dielectric layer can be formed by selectively depositing the memory gate dielectric layer on the at least one layer of conductive material in the second sub-stack, as shown in FIG. 13. The one or more conductive material layers of the memory structure may be etched a recessed gap in the channel opening, and the memory gate dielectric layer can be formed to fill the recessed gap.

At step 2620, the method includes providing a channel structure in the channel opening. To do so, techniques described in connection with FIG. 14 may be used. The channel structure can be in contact with the memory gate dielectric layer and aligned with the first transistor structure and the second transistor structure, as shown in FIG. 14. In some implementations, a core channel opening can be formed through the channel structure. The core channel opening can be formed by forming a self-aligned space on the channel structure, forming a self-aligned dielectric in the self-aligned space; and etching the core channel opening through the self-aligned space and the channel structure, as described in connection with FIG. 15. A core dielectric can be formed in the core channel opening, as described in connection with FIG. 16. In some implementations, a dielectric cap can be formed on the channel structure, for example, if an air gap is desired in the core channel opening rather than a dielectric core material.

Referring to FIG. 27, depicted is a flow diagram of a method 2700 for fabricating memory devices integrated with 3D vertical logic. The method 2700 may include steps 2705-2730. However, other embodiments may include additional or alternative steps or may omit one or more steps altogether.

At step 2705, the method includes forming a stack of layers. Forming the stack of layers can include performing the processes described in connection with FIG. 1. The stack of layers can include a first conductive source/drain layer (e.g., the first S/D layer 108A), a first gate conductive layer (e.g., the first gate layer 112A) separated from the first conductive source/drain layer by at least one dielectric layer (e.g., the dielectric layer 110A), and a second source/drain layer (e.g., the second S/D layer 108B) separated from the first gate conductive layer by at least one dielectric layer. The stack of layers can include a second sub-stack for a memory structure positioned on the first sub-stack. The second sub-stack can include at least one layer of conductive material (e.g., the conductive material 114) and at least one layer of non-conductive material (e.g., the dielectric 106). The stack of layers can include a third sub-stack for a second transistor structure. The third sub-stack can include a third conductive source/drain layer (e.g., the third S/D layer 108C), a second gate conductive layer (e.g., the second gate layer 112B) separated from the third conductive source/drain layer by at least one dielectric layer, and a fourth source/drain layer (e.g., the fourth S/D layer 108D) separated from the second gate conductive layer by at least one dielectric layer.

At step 2710, the method includes forming a channel opening in the stack of layers. To do so, processes similar to those described in connection with FIG. 2 may be performed. For example, an etching process described in connection with FIG. 2 may be used to define the channel opening through the memory structure and the transistor structure. A substrate layer (e.g., the base layer 104) may act as an etch stop layer when etching the channel opening. Defining the channel opening may include defining an opening for any number of transistor structures or memory structures, as described herein.

At step 2715, the method includes providing a first channel structure within the channel opening. The first channel structure comprising a semiconductive-behaving material and aligned with the first transistor structure. To form the first channel structure can be formed using processes described in connection with FIG. 4. In some implementations, the method includes forming a first gate dielectric on the first gate conductive layer prior to providing the first channel structure, as described in connection with FIG. 3. Similarly, a second gate dielectric may be formed on the second gate conductive layer of the second transistor structure using similar techniques, prior to providing the channel structures in the channel opening. The semiconductive-behaving material may be an N-type semiconductive-behaving material or a P-type semiconductive-behaving material. In some implementations, the channel structure can be formed on a seed layer. In such implementations, the channel structure may be formed using epitaxial techniques. In some implementations, a second core opening (e.g., the inner core opening) can be formed in the first channel structure, and a second core dielectric (e.g., the inner core dielectric) can be formed in the second core opening, as described in connection with FIGS. 17, 18, and 19.

At step 2720, the method includes depositing a memory dielectric layer in the channel opening and aligned with the memory structure. Depositing the memory dielectric layer can be performed using an ALD process. The memory dielectric layer can be a hafnium zirconium oxide. To form the memory dielectric layer, the processes described in connection with FIG. 20 may be used. The memory dielectric layer may be formed to have a predetermined thickness. The memory dielectric layer may be selectively (e.g., directionally) etched to form the memory dielectric layer on the walls of the channel opening, such that the memory dielectric layer is aligned with the memory structure in the stack of layers.

At step 2725, the method includes depositing a second channel structure in the channel opening and aligned with the second transistor structure. The second channel structure in contact with the memory dielectric layer and defining a core opening. To form the second channel structure, processes described in connection with FIG. 21 may be used. The second channel structure may be formed by depositing the semiconductive behaving material on the memory dielectric layer in the channel opening. The second channel structure may be formed to have a predetermined thickness, which defines the diameter of a core opening in the semiconductive-behaving material. The second channel structure may be directionally etched to align with the inner core dielectric formed in the first transistor device.

At step 2730, the method includes forming a core dielectric (e.g., the dielectric 124) in the core opening. To do so, processes described herein in connection with FIG. 22 may be performed. In some implementations, a CMP process may be performed after depositing the core dielectric. A portion of the memory dielectric layer that is aligned with the second transistor structure can be removed to form a gap, as described in connection with FIG. 23. The gap can be filled with the semiconductive-behaving material to couple the second transistor structure to the second channel structure, as described in connection with FIG. 24.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method comprising:
    forming a stack of layers including:
        a first sub-stack for a first transistor structure, the first sub-stack including a first conductive source/drain layer, a first gate conductive layer separated from the first conductive source/drain layer by at least one dielectric layer, and a second source/drain layer separated from the first gate conductive layer by at least one dielectric layer;
        a second sub-stack for a memory structure positioned on the first sub-stack, the second sub-stack including at least one layer of conductive material and at least one layer of non-conductive material; and a third sub-stack for a second transistor structure, the third sub-stack including a third conductive source/drain layer, a second gate conductive layer separated from the third conductive source/drain layer by at least one dielectric layer, and a fourth source/drain layer separated from the second gate conductive layer by at least one dielectric layer;

forming a channel opening in the stack of layers;

providing a first channel structure within the channel opening, the first channel structure aligned with the first transistor structure;

forming a memory dielectric layer in the channel opening and aligned with the memory structure; and providing a second channel structure in the channel opening in contact with the memory dielectric layer and aligned with the second transistor structure.

2. The method of claim 1, further comprising forming a first gate dielectric on the first gate conductive layer prior to providing the first channel structure.

3. The method of claim 2, wherein forming the first gate dielectric further comprises forming a second gate dielectric on the second gate conductive layer prior to forming the second channel structure.

4. The method of claim 1, further comprising forming a core channel opening through the first channel structure and the second channel structure.

5. The method of claim 4, wherein forming the core channel opening comprises:

forming a self-aligned space on the second channel structure;

forming a self-aligned dielectric in the self-aligned space; and etching the core channel opening through the self-aligned space, the second channel structure, and the first channel structure.

6. The method of claim 4, further comprising forming a core dielectric in the core channel opening.

7. The method of claim 1, wherein the first channel structure and the second channel structure are the same material.

8. The method of claim 1, further comprising:

removing a portion of the memory dielectric layer that is aligned with the second transistor structure to form a gap; and filling the gap with a semiconductive-behaving material to couple the second channel structure with the second transistor structure.

9. A method comprising:

forming a stack of layers including:

forming a first sub-stack for a first transistor structure;

forming a second sub-stack for a memory structure positioned on the first sub-stack; and forming a third sub-stack for a second transistor structure;

forming a channel opening in the stack of layers;

forming a memory gate dielectric layer in the channel opening on the at least one layer of conductive material in the second sub-stack;

providing a channel structure in the channel opening in contact with the memory gate dielectric layer and aligned with the first transistor structure and the second transistor structure.

10. The method of claim 9, further comprising forming a dielectric cap on the channel structure.

11. The method of claim 9, wherein forming the memory gate dielectric layer comprises selectively depositing the memory gate dielectric layer on the at least one layer of conductive material in the second sub-stack.

12. The method of claim 9, wherein:

the first sub-stack including a first conductive source/drain layer, a first gate conductive layer separated from the first conductive source/drain layer by at least one dielectric layer, and a second source/drain layer separated from the first gate conductive layer by at least one dielectric layer;

the second sub-stack including at least one layer of conductive material and at least one layer of non-conductive material; and the third sub-stack including a third conductive source/drain layer, a second gate conductive layer separated from the third conductive source/drain layer by at least one dielectric layer, and a fourth source/drain layer separated from the second gate conductive layer by at least one dielectric layer.

13. The method of claim 12, wherein forming the memory gate dielectric layer on the at least one layer of conductive material comprises:

etching a portion of the at least one layer of conductive material to create a recessed gap in the channel opening; and forming the memory gate dielectric layer on the at least one layer of conductive material such that the memory gate dielectric layer fills the recessed gap.

14. The method of claim 9, further comprising forming a core channel opening through the channel structure.

15. The method of claim 14, wherein forming the core channel opening comprises:

forming a self-aligned space on the channel structure;

forming a self-aligned dielectric in the self-aligned space; and etching the core channel opening through the self-aligned space and the channel structure.

16. The method of claim 14, further comprising forming a core dielectric in the core channel opening.

* * * * *